(12) United States Patent
Kalevo et al.

(10) Patent No.: US 9,729,169 B2
(45) Date of Patent: Aug. 8, 2017

(54) METHODS AND DEVICES FOR SOURCE-CODING AND DECODING OF DATA INVOLVING SYMBOL COMPRESSION

(71) Applicant: GURULOGIC MICROSYSTEMS OY, Turku (FI)

(72) Inventors: Ossi Kalevo, Akaa (FI); Tuomas Karkkainen, Turku (FI); Artur Huhtaniemi, Turku (FI)

(73) Assignee: GURULOGIC MICROSYSTEMS OY (FI)

(*) Notice: Subject to any disclaimer, the term of this patent is extended or adjusted under 35 U.S.C. 154(b) by 0 days.

(21) Appl. No.: 15/119,365

(22) PCT Filed: Feb. 20, 2015

(86) PCT No.: PCT/EP2015/025008
§ 371 (c)(1),
(2) Date: Aug. 16, 2016

(87) PCT Pub. No.: WO2015/124324
PCT Pub. Date: Aug. 27, 2015

(65) Prior Publication Data
US 2017/0063392 A1    Mar. 2, 2017

(30) Foreign Application Priority Data
Feb. 20, 2014    (GB) .................................. 1403039.9

(51) Int. Cl.
*H03M 7/40*     (2006.01)
*H03M 7/30*     (2006.01)
(Continued)

(52) U.S. Cl.
CPC ........... *H03M 7/6058* (2013.01); *H03M 7/40* (2013.01); *H03M 7/4006* (2013.01); *H03M 7/42* (2013.01);
(Continued)

(58) Field of Classification Search
CPC .. H03M 7/6058; H03M 19/91; H03M 7/4006; H04N 19/436; H04N 19/625
(Continued)

(56) References Cited

U.S. PATENT DOCUMENTS 5,838,266 A     11/1998 Houle et al.
2011/0249754 A1    10/2011 Karczewicz et al.
(Continued)

OTHER PUBLICATIONS

International Search Report issued in International Patent Application No. PCT/EP2015/025008 with Date of mailing Jun. 8, 2015.
Written Opinion of the International Searching Authority issued in International Patent Application No. PCT/EP2015/025008 with Date of mailing Jun. 8, 2015.
(Continued)

*Primary Examiner* — Peguy Jean Pierre
(74) *Attorney, Agent, or Firm* — Eric L. Sophir; Dentons US LLP

(57) ABSTRACT

A method of encoding input data in an encoder to generate corresponding encoded data includes splitting and/or transforming the input data into data chunks, analyzing symbols present in the input data and compressing the symbols as a function of occurrence of the symbols in the data chunks; generating code tables, frequency tables, and/or length of code word tables for the symbols present in the data chunks; computing sets of indices relating the symbols in each data chunk and/or the compressed symbols to entries in the code tables, the frequency tables, and/or the length of code word tables; and assembling the sets of indices, together with the frequency tables, the code tables, and/or information indicative of such tables, for generating the encoded data. An encoder that utilizes the method, together with a corresponding decoder, wherein the encoder and the decoder in combination form a codec.

75 Claims, 4 Drawing Sheets

(51) Int. Cl.
   *H04N 19/91*   (2014.01)
   *H04N 19/625*  (2014.01)
   *H03M 7/42*    (2006.01)
   *H04N 19/436*  (2014.01)
   *H04N 19/44*   (2014.01)

(52) U.S. Cl.
   CPC .......... *H04N 19/436* (2014.11); *H04N 19/44* (2014.11); *H04N 19/625* (2014.11); *H04N 19/91* (2014.11)

(58) Field of Classification Search
   USPC .................. 341/106, 50, 51, 107, 67, 65
   See application file for complete search history.

(56) References Cited

U.S. PATENT DOCUMENTS

| | | |
|---|---|---|
| 2012/0199300 A1 | 8/2012 | Edwards et al. |
| 2014/0085115 A1* | 3/2014 | Beier ................... H03M 7/30 341/106 |
| 2014/0241425 A1 | 8/2014 | Sasai et al. |

OTHER PUBLICATIONS

Gurulogic Microsystems Oy, "Encoder Decoder and Method," filed on Feb. 20, 2014 with Application No. GB1403038.1.
Notification of Transmittal of the International Preliminary Report on Patentability issued in International Patent Application No. PCT/EP2015/025008 with Date of mailing May 10, 2016.

* cited by examiner

METHODS AND DEVICES FOR SOURCE-CODING AND DECODING OF DATA INVOLVING SYMBOL COMPRESSION

CROSS-REFERENCE TO RELATED APPLICATIONS

This application is a National Stage of PCT/EP2015/025008, filed Feb. 20, 2015, which claims priority under 35 U.S.C. §119 to GB Application No. 1403039.9, filed Feb. 20, 2014, all of which are incorporated herein by reference in their entirety.

TECHNICAL FIELD

The present disclosure relates to methods of encoding input data to generate corresponding encoded data. Moreover, the present disclosure also relates to methods of decoding aforesaid encoded data to generate corresponding decoded output data. Furthermore, the present disclosure also relates to encoders and decoders which are operable to implement aforesaid methods. Additionally, the present disclosure relates to computer program products comprising a non-transitory computer-readable storage medium having computer-readable instructions stored thereon, the computer-readable instructions being executable by a computerized device comprising processing hardware for executing aforementioned methods.

BACKGROUND

In overview, as illustrated in FIG. 1, known encoding methods of encoding input data D1 to generate corresponding encoded output data E2 involve applying one or more transformations T to the input data D1 to generate corresponding transformed encoded output data E2, wherein the transformed encoded output data E2 has associated therewith coding table data C information which is indicative of one or more coding tables defining the one or more transformations T employed. The encoded transformed data E2 and the coding table data C information, namely collectively the encoded output data E2, are often communicated via a data carrier and/or via a data communication network to one or more decoders which are operable to apply one or more inverse transformations $T^{-1}$ to decode the encoded output data E2 to generate corresponding decoded data D3. It is often desirable that the encoded output data E2 is compressed relative to the input data D1, for example to reduce communication network capacity load when communicating the encoded output data E2. Moreover, it is also desirable that the encoded output data E2 is compressed in a substantially lossless manner, so that the decoded data D3 is an accurate reproduction of information included in the input data D1. Data compression achievable in the encoded output data E2 relative to the input data D1 is potentially inefficient when the coding table data C information is significant in size relative to the encoded transformed data E2, namely the coding table data C information corresponds to a significant data overhead in the transformed encoded data E2.

There are several known methods of encoding the input data D1 to generate the encoded output data E2. For example, known Huffman encoding or other VLC encoding methods are often employed to compress various types of data. Moreover, Arithmetic coding, or Range coding, are becoming increasingly popular for compressing input data, but are quite inefficient in situations where:

(i) a frequency table for the input data D1 is not already known by an encoder which is operable to encode the input data D1 to generate corresponding encoded output data E2, and by a decoder which is operable to decode the encoded output data E2; and (ii) the amount of input data is relatively small, for example in a situation where the input data D1 is being communicated in small data segments or data chunks, wherein each data segment or data chunk is accompanied by a corresponding frequency table.

As aforesaid, such inefficiency arises due to delivery of one or more frequency tables consuming considerable data space, if it cannot be selected using relatively few identification parameters from a list of possible frequency tables, for example which the decoder has stored locally thereat. Moreover, it is also less probable to find suitable frequency tables than suitable code tables from such a list. Often, the input data D1 to be encoded can also vary locally, for example it is transformed during transmission through a communication network to conform to spatially local data standards for the communication network.

There are known methods available for delivering code tables or frequency tables in association with communicating encoded data content derived from symbols. Most of the known methods employ a direct delivery of a Huffman tree or frequencies of the symbols. Such known methods are not so satisfactory, because they require considerable information to be delivered from an encoder to a corresponding decoder. Moreover, there are also known methods of delivering lengths of code table symbols, for example as employed in a known Intel IPP-library, which has been contemporarily deprecated; there is employed a method of compressing a code table, namely by way of "HuffLenCodeTablePacK", and decoding it back again, namely by way of "HuffLenCodeTableUnpack"; however, this method is not satisfactory and sometimes even increases the size of data during encoding processes. Moreover, the method also requires that there are 256 symbols, and all the symbols from 0 to 255 have a non-zero length for their code words. Methods that deliver code tables are still clearly amongst most efficient delivery mechanisms that are currently available for prefix codes that are generated, for example by Huffman encoding techniques. When a Huffman tree is delivered from an encoder to a corresponding decoder, generated code symbols from the encoder are always similar in the encoder and in the decoder. When only a frequency table is delivered, there then has to be similar algorithms used in an encoder and in a decoder for actual Huffman tree generation from the frequency table to be achieved, if the Huffman tree is needed, to enable decoding of the symbols in a proper manner at the decoder. If the lengths of code table symbols are delivered, then similar methods from lengths of symbol-to-frequency-table transformation are also needed in the encoder and in the decoder to enable decoding of the symbols in a proper manner. Communicating lengths of symbols from the encoder to the decoder is not a practical method of delivering frequencies for Arithmetic coding and Range coding, because they are designed to support more accurate frequency tables than merely enabled by communicating the lengths of code symbols. Lengths of code symbols can also be used in Arithmetic coding and Range coding. However, these methods do not offer benefits compared to Huffman Coding for example, if no adaptive update of tables is executed later for future data. Delivery of information which is indicative of probabilities offers usually more optimal coding results with Range coding or Arithmetic coding in contradistinction to Huffman coding.

The probabilities of the symbols can be calculated by dividing frequencies of occurrence of the symbols by a sum of the symbol frequencies of occurrence, namely=number of symbols. A delivery of such probabilities is beneficially made by using scaled probability values. Scaled probability values can be calculated by multiplying original symbol probability values with an integer number that is advantageously a power of two value, namely $2^n$ wherein n is an integer, and by then rounding it to a nearest integer value. The sum of these scaled probabilities as integer numbers is equalized to be the same as the multiplier value. An escape code symbol is also beneficially created for symbols that otherwise are not allocated their own non-zero scaled probability value. This means that those symbols that need an escape code have a probability that is smaller than what can be presented with the selected multiplier value. It is also possible to create scaled probabilities without employing an escape code with two different mechanisms. The multiplier value can be increased and then the new probability values can be calculated. It is also possible to upgrade those scaled probability values for available symbols that are equal to zero to be equal to one. This probability value upgrade requires that the increase of the probability values are compensated by decreasing the probability values of the other symbols. This is done so as to make the sum of probabilities exactly the same as the multiplier value. This procedure makes the probability values not as well optimized as could be possible, but escape symbols are not needed, and in some cases it might be still the optimal coding solution. Lengths of symbols or probability values define rough estimate of frequency table that can be used for methods that employ variable length coding symbols, for example Huffman coding, Range coding, Arithmetic coding and any other variable length coding methods. It will be appreciated that the scaled probability table can directly be used as the rough estimate of symbol frequencies when they are needed, and lengths of symbols need to be first converted to the rough estimate of symbol frequencies before the utilization. The conversion from length of symbols to frequency table will be shown later during the data encoding and table delivery.

Many known practical methods of encoding data do not utilize optimized code tables at all, namely they utilize fixed code tables for encoding data to generate corresponding encoded data, and fixed code tables for subsequently decoding the encoded data. Sometimes tables are updated with adaptive methods based on the delivered symbols. In certain known methods, there are sometimes utilized a couple of different code tables, alternatively frequency tables, for encoding data in an encoder and correspondingly decoding the encoded data in a decoder, wherein an index defining a selected code table, probability table, or frequency table, is delivered as information from the encoder to the decoder. In certain methods, there are employed separate tables for luminance and color channels, for inter- and intra-blocks, or for different kinds of data; however, the separate tables are communicated in an inefficient manner; for example, reference is herewith made to a following Internet web-site (Wikipedia): http://en.wikipedia.org/wiki/Huffman_coding. During decompression, using Huffman-based methods, a Huffman tree must be reconstructed. In a simplest case, where character frequencies are relatively predictable, the tree is susceptible to being reconstructed, and even statistically adjusted on each compression cycle, and thus reused every time, at an expense of at least some measure of compression efficiency; alternatively, Huffman-tree information must be sent a priori, namely, beforehand.

A simple approach of prepending frequency counts relating to symbols that are coded into an output stream of compressed data has a major disadvantage of increasing a data volume in the compressed data by at least several kiloBytes (kB) in practice, so such a simple approach has little practical use. If the data is compressed using canonical encoding, the compression model can be precisely reconstructed with just $B2^B$ bits of information, wherein B is the number of bits per symbol, for example, with 8 bits it requires 2 kB.

Another method is simply to prepend the Huffman tree, bit by bit, to the compressed output stream. For example, assuming that the value of 0 represents a parent node and 1 a leaf node, whenever the latter is encountered, a tree-building routine simply reads a next 8 bits to determine a character value of that particular leaf. Such a process continues recursively until a last leaf node is reached; at that point, the Huffman tree will thus be faithfully reconstructed, for example at a decoder. A data overhead arising from using such a method ranges from roughly 2 to 320 bytes, assuming an 8-bit alphabet.

In order to elucidate further known methods of encoding data and corresponding methods of decoding encoded data, Huffman decoding will next be described in overview. It will be appreciated that any other methods, for example Range decoding or Arithmetic decoding, can also be utilized instead of Huffman decoding. Before commencing compression of a data file, a compressor, in an encoder, has to determine codes to be employed when executing the compression.

When Huffman decoding is employed, before starting compression of a given data file including symbols to generate corresponding encoded output data, an encoder has to determine codes that are to be used to represent the given data. Conveniently, the codes are based on probabilities, namely frequencies of occurrence, of the symbols in the given data file. However, the frequencies, probabilities, or lengths of symbols have to be recorded, for example as side information, namely as supplementary information, in the encoded output data, so that any Huffman decoder will be able to decode the encoded output data to generate corresponding decoded data. Conveniently, the frequencies of occurrence or lengths of symbols are integers, or probabilities which can be expressed as scales integers; such integers included in the supplementary information add often merely a few hundred bytes to the encoded output data. Optionally, it is also possible to write variable length codes themselves to the encoded output data, but this may in certain circumstances be awkward, because the codes may have mutually different sizes. Alternatively, it is feasible to write the Huffman tree to the encoded output data, but this requires more data to be communicated than merely communicating frequencies of occurrence of the symbols in the given data.

During operation, the decoder must be provided with information regarding what is at a start of an encoded compressed file received at the decoder for being decoded. From data extracted from the encoded compressed file, for example from a start thereof, the decoder is operable to construct an alphabet of a Huffman tree. After the Huffman tree has been constructed in the decoder, the decoder is then able to decode a remainder of the file, using the Huffman tree as a decoding tool. The decoder employs a relatively simple decoding algorithm which includes following steps:

(a) start at a root of the Huffman tree, and then read a first bit of the encoded output data to be decoded using the Huffman tree;

(b) if the first bit is a "1", then follow a top edge of the Huffman tree; if the first bit is a "0", then follow a bottom edge of the Huffman tree;

(c) read a second bit of the encoded output data, and then employ the second bit in a manner akin to the step (b) towards "leaves" of the Huffmann tree, and so on until a "leaf" of the Huffman tree is eventually reached, whereat an original uncompressed symbol is to be found, often an associated ASCII code; that code is then output from the decoder; and (d) steps (b) and (c) are repeated until the encoded output data has been decoded.

Known contemporary Huffman encoding is beneficial to employ when an encoded string is large in size relative to a code table employed to generate the string. Moreover, such contemporary Huffman coding is beneficial to employ when a code table is defined a priori for both an encoder and a corresponding decoder. There is thus a need for alternative encoding methods which address aforementioned limitations associated with known approaches to encoding and decoding data, for example aforesaid Huffman encoding and decoding methods.

SUMMARY

The present invention seeks to provide an improved method of encoding data (D1) to generate corresponding encoded data (E2).

The present invention also seeks to provide an improved encoder which is operable to employ the aforesaid improved method of encoding data.

The present invention seeks to provide an improved method of decoding encoded data (E2) to generate corresponding decoded data (D3).

The present invention seeks to provide an improved decoder for decoding aforesaid encoded data (E2) to generate corresponding decoded data (D3).

According to a first aspect, there is provided a method of encoding input data (D1) in an encoder to generate corresponding encoded data (E2), characterized in that the method includes:

(a) analyzing symbols present in the input data (D1) and splitting and/or transforming the input data (D1) into one or more data chunks;

(b) generating as a function of occurrence of the symbols at least one of: one or more code tables, one or more frequency tables, one or more length of code word tables, one or more probability tables for the symbols present in the one or more data chunks;

(c) computing one or more sets of indices relating the symbols in each data chunk to entries in at least one of: the one or more code tables, the one or more frequency tables, the one or more length of code word tables, the one or more probability tables;

(d) assembling information of the one or more sets of indices relating the symbols in each data chunk, together with at least one of: the one or more frequency tables, the one or more code tables, the one or more length of code word tables, the one or more probability tables, information indicative of the one or more tables, to the encoded data (E2); and (e) compressing the symbols within the one or more tables to the encoded data (E2).

The present invention is of advantage in that the method involves splitting, namely dividing, the input data (D1) into one or more data chunks, and/or compressing symbols in the input data (D1), so that the input data (D1) can be efficiently encoded, for example in a manner which is best suited for each data chunk or compressed symbol, using indices ("indexes") and associated one or more tables referenced by the indices.

Optionally, in the method, at least one of the one or more tables is pre-defined.

Optionally, the method includes delivering the encoded data (E2) containing the information of the one or more sets of indices relating the symbols in each data chunk, together with at least one of: the one or more frequency tables, the one or more code tables, the one or more length of code word tables, the one or more probability tables, the information indicative of the one or more tables as well as the compressed symbols.

Optionally, the method includes generating the one or more tables for being regenerated during decoding based upon their symmetry and corresponding symmetry-indicative information.

Optionally, the method includes delivering at least one of the one or more tables in a manner in which the at least one of the one or more tables is storable for subsequent reuse.

Optionally, in the method, the information of the one or more sets of indices includes:

indices of the symbols that occur in the chunk as such, and of which probability values are to be inserted into the encoded data (E2), preceded by a total count of indices in the data chunk; or (ii) bits expressing which symbols out of all possible symbol values occur in the chunk and for which symbols probability values are to be inserted into the encoded data (E2); or (iii) information stating that starting from the beginning, all symbol value probabilities to be inserted into the encoded data (E2), which in itself also expresses the count of indices.

The aforesaid splitting, namely dividing, optionally includes subdividing of the input data (D1).

Optionally, in (a), splitting is usually done, but sometimes it is also necessary to compress the available data chunk with the optimal code table without splitting the data into new data chunks. Moreover, sometimes, the original data is not split, but instead, new data are created, for example by one or more transformations to one or more data chunks that need to be compressed most efficiently. Encoders implemented pursuant to the present disclosure can be used to create different data chunks. Thus, it will be appreciated that this method is especially well suitable for video codecs and audio codecs that are operable to code data with chunks that are from different time slots. Different frames or sections are different data chunks and they can still be split to one or more chunks by using encoders implementing one or more methods pursuant to the present disclosure. All these data chunks can reuse any table that is delivered earlier, for example in the same or in the previous frames.

Embodiments of the present invention enable efficient delivery of code tables or frequency tables. This reduces a data communication and/or data storage overhead needed for table delivery and/or storage. It also enables smaller data chunks to be coded by utilizing coding tables which are better optimized for each individual data chunk. Thereby, increased greater compression efficiency can be achieved, which means that the data storage capacity, the transmission bandwidth and the energy consumption can be reduced.

Frequencies of various parts of data are often mutually different, and often their relative data entropy is also mutually different, and for such reasons it is beneficial to split the data into multiple portions, namely data chunks. Beneficially, different code tables are used for the portions, depending upon a nature of data and/or type of data and/or content of data of the portions; by "nature" is meant one or more characteristics and/or parameters of the data. The present invention provides methods which enable a given large data file to be split more efficiently to smaller portions, namely data chunks, with an associated benefit that the delivery of the code table or frequency table can be optimized for such data chunks. This split of the big data file enables substantial benefits in respect of modifying entropy of data involved, and so it is capable of highly reducing an amount of encoded data to be communicated. The data values in one or more data chunks can also be split, as aforementioned. This splitting, namely dividing, of data value can be implemented, for example, by mutually separating the MSB (most significant bits) and LSB (least significant bits). The data values are also optionally split to more than two separate data value chunks.

Optionally, the method includes applying one or more data compression algorithms in step (d) to generate the encoded data (E2). More optionally, in the method, the one or more data compression algorithms include at least one of: Huffman encoding, VLC, entropy encoding, Arithmetic encoding, Range encoding, but are not limited thereto.

Optionally, the method includes splitting the input data (D1) into a plurality of data chunks and employing a parallel architecture of processors for processing the plurality of data chunks in a substantially concurrent manner.

Optionally, the method includes generating the one or more sets of indices based on multiple data values that are combined together. More optionally, in the method, indices (namely "indexes") are derived from one or more RGB-pixels or YUV-pixels, that contain R, G and B pixel values or Y, U and V pixel values.

More optionally, the method includes dynamically switching between assembling the data chunks either unencoded or encoded into the encoded data (E2), as a function of an achievable data compression ratio for the data chunks when included in the encoded data (E2).

Optionally, the method includes incorporating into the encoded data (E2) at least one trailing bit to indicate if a symbol pertains to "change of code table" or to "end of data".

Optionally, the method includes generating for a given data chunk substantially only enough indices required for referencing to one or more symbols present in the given data chunk.

Optionally, delivered code tables are also compressed, for example by employing Huffman coding, and such code table compression method is also optionally provided with its own associated one or more code tables. More optionally, in the method, the compression of the one or more code tables employs one or more subsidiary code tables.

Optionally, the method includes communicating the one or more code tables in a manner which enables the one or more code tables to be employed in a decoder for decoding subsequently sent data.

Optionally, the method includes a step of including in the encoded data (E2) one or more identification codes indicating from where the one or more code table are susceptible to being accessed, via one or more databases, and/or one or more proxy databases.

Optionally, the method is arranged to encode one or more of following types of data: captured audio signals, captured video signals, captured images, text data, seismographic data, sensor signals, analog-to-digital (ADC) converted data, biomedical signal data, calendar data, economic data, mathematical data, binary data.

According to a second aspect, there is provided an encoder for encoding input data (D1) to generate corresponding encoded data (E2), characterized in that the encoder includes:

(a) an analyzer for analyzing symbols present in the input data (D1), and for splitting and/or transforming the input data (D1) into one or more data chunks;

(b) a generator for generating, as a function of occurrence of the symbols at least one of: one or more code tables, one or more frequency tables, one or more length of code word tables, one or more probability tables for the symbols present in the one or more data chunks;

(c) a computing engine for computing one or more sets of indices (namely "indexes") relating the symbols in each data chunk to entries in at least one of: the one or more code tables, the one or more frequency tables, the one or more length of code word tables, the one or more probability tables;

(d) a data assembler for assembling information of the one or more sets of indices relating the symbols in each data chunk, together with at least one of: the one or more frequency tables, the one or more code tables, the one or more length of code word tables, the one or more probability tables, information indicative of the one or more tables, to the encoded data (E2); and (e) a compressor for compressing the symbols within the one or more tables to the encoded data (E2).

Such splitting, namely dividing, optionally includes subdividing of the input data (D1).

Optionally, in (a), splitting is usually done, but sometimes it is also necessary to compress the available data chunk with the optimal code table without splitting the data to new data chunks. Moreover, sometimes, the original data is not split, but instead, new data are created, for example by one or more transformations to one or more data chunks that need to be compressed most efficiently. Encoders implemented pursuant to the present disclosure can be used to create different data chunks. Thus, it will be appreciated that this method is especially well suitable for video codecs and audio codecs that codes the data with chunks that are from different time slots. Different frames or sections are different data chunks and they can still be split to one or more chunks by using encoders implementing method pursuant to the present disclosure. All these data chunks can reuse any table that is delivered earlier, for example in the same or in the previous frames.

Optionally, the encoder is operable to deliver the encoded data (E2) containing the information of the one or more sets of indices relating the symbols in each data chunk, together with at least one of: the one or more frequency tables, the one or more code tables, the one or more length of code word tables, the one or more probability tables, the information indicative of the one or more tables as well as the compressed symbols.

Optionally, the encoder is operable to deliver at least one of the one or more tables in a manner in which the at least one of the one or more tables is storable for subsequent reuse.

Optionally, the encoder is operable to apply one or more data compression algorithms in the data assembler to generate the encoded data (E2). More optionally, in the encoder, the one or more data compression algorithms include at least one of: Huffman encoding, VLC, entropy encoding, Arithmetic encoding, Range encoding.

Optionally, the encoder is operable to split the input data (D1) into a plurality of data chunks and to employ a parallel architecture of processors for processing the plurality of data chunks in a substantially concurrent manner.

Optionally, in the encoder, the generator is operable to generate the one or more sets of indices based on multiple data values that are combined together. More optionally, in the encoder, indices are derived from one or more RGB-pixels or YUV-pixels that contain R, G and B pixel values or Y, U, and V pixel values. More optionally, the encoder is operable to switch dynamically between assembling the data chunks either unencoded or encoded into the encoded data (E2), as a function of an achievable data compression ratio (achievable) for the data chunks when included in the encoded data (E2).

Optionally, the encoder is operable to incorporate into the encoded data (E2) at least one trailing bit to indicate if a symbol pertains to "change of code table" or to "end of data".

Optionally, in the encoder, the generator is operable to generate for a given data chunk substantially only enough indices required for referencing to one or more symbols present in the given data chunk.

Optionally, delivered code tables are compressed, for example by employing Huffman coding, and this compression method optionally sometimes needs its own one or more associated code tables.

Optionally, delivered code tables can be reused in the same data frame or in the next data frames, namely the data chunk encoding can reuse any table that is delivered before it for the other data chunk in this data frame or in the previous data frames.

Optionally, optimal implementations for delivering the table are beneficially employed when implementing the encoder, for example in encoded data, or by including in the encoded data one or more identification codes indicating from where the table can be accessed, for example from one or more databases, one or more proxy databases and similar.

Optionally, to provide for more efficient encoding of data, delivery of encoded data and decoding of encoded data, it is beneficial that delivered and/or referenced tables, as aforementioned, are stored, for example to be used later, for example when the index of the stored table has been delivered. Such an approach is capable of reducing a volume of data that, for example needs to be communicated from an encoder to a corresponding decoder, pursuant to the present disclosure.

According to a third aspect, there is provided a computer program product comprising a non-transitory computer-readable storage medium having computer-readable instructions stored thereon, the computer-readable instructions being executable by a computerized device comprising processing hardware to execute the method pursuant to the first aspect.

According to a fourth aspect, there is provided a method of decoding encoded data (E2) generated by the encoder pursuant to the second aspect; there is provided a method in a decoder of decoding encoded data (E2) generated by the encoder, for generating corresponding decoded data (D3), characterized in that the method includes:

receiving the encoded data (E2) and extracting therefrom information of one or more sets of indices, together with at least one of: one or more frequency tables, one or more code tables, one or more length of code word tables, one or more probability tables, information indicative of the one or more tables;

(ii) computing from the one or more sets of indices corresponding symbols in at least one of: one or more data chunks, compressed symbols of entries in the one or more code tables, the one or more frequency tables, the one or more length of code word tables, the one or more probability tables;

(iii) regenerating from the symbols one or more data chunks, using information from at least one of: the one or more code tables, the one or more frequency tables, the one or more length of code word tables, the one or more probability tables; and (iv) combining and/or transforming the one or more data chunks to generate the decoded data (D3).

Optionally, in the method, at least one of the one or more tables is pre-defined.

Optionally, the method includes transcoding the decoded data (D3) to generate corresponding transcoded data (D4) and/or generating the corresponding transcoded data (D4) from the encoded data (E2).

Optionally, the method includes regenerating the one or more tables based upon their symmetry and corresponding symmetry-indicative information.

Optionally, the method includes receiving at least one of the one or more tables in a manner in which the at least one of the one or more tables is storable for subsequent reuse.

Optionally, the method includes applying one or more data decompression algorithms in step (iv) to generate the decoded data (D3). More optionally, in the method, the one or more data decompression algorithms include at least one of: Huffman decoding, VLC decoding, entropy decoding, Arithmetic decoding, Range decoding.

Optionally, the method includes combining a plurality of the one or more data chunks to generate the decoded data (D3) by employing a parallel architecture of processors for processing the plurality of data chunks in a substantially concurrent manner.

Optionally, the method includes generating the one or more sets of indices based on multiple data values that are combined together. More optionally, in the method, the indices are derived from one or more RGB-pixels or YUV-pixels that contain R, G and B pixel values or Y, U and V pixel values. More optionally, the method includes switching dynamically between generating the one or more data chunks either unencoded or encoded into the encoded data (E2), as a function of an achievable data decompression ratio for the data chunks when included in the encoded data (E2).

Optionally, in the method, the decoder is operable to extract from the encoded data (E2) at least one trailing bit which is indicative of if a symbol pertains to "change of code table" or to "end of data".

Optionally, the method includes generating a given data chunk substantially from only enough indices required for referencing to one or more symbols present in the given data chunk.

Optionally, the method includes decompressing the one or more code tables included in the encoded data (E2). More optionally, the method includes decompressing the one or more code tables by employing Huffman decoding. More optionally, in the method, decompression of the one or more code tables employs one or more subsidiary code tables.

Optionally, the method includes receiving the one or more code tables in a manner which enables the one or more code tables to be employed in the decoder for decoding subsequently sent data.

Optionally, the method includes extracting from the encoded data (E2) one or more identification codes indicating from where the one or more code table are susceptible to being accessed, via one or more databases, and/or one or more proxy databases.

Optionally, the method includes decoding one or more of following types of data: captured audio signals, captured video signals, captured images, text data, seismographic data, sensor signals, analog-to-digital (ADC) converted data, biomedical signal data, calendar data, economic data, mathematical data, binary data.

Optionally, the method includes receiving the encoded data (E2) from a plurality of data sources, and to combine data provided from the sources to regenerate the encoded data (E2).

According to a fifth aspect, there is provided a computer program product comprising a non-transitory computer-readable storage medium having computer-readable instructions stored thereon, the computer-readable instructions being executable by a computerized device comprising processing hardware to execute the method pursuant to the fourth aspect.

According to a sixth aspect, there is provided a decoder for decoding encoded data (E2) generated by the encoder pursuant to the second aspect; there is provided a decoder for decoding encoded data (E2) generated by the encoder for generating corresponding decoded data (D3), characterized in that the decoder is operable:

to receive the encoded data (E2) and to extract therefrom information of one or more sets of indices, together with at least one of: one or more frequency tables, one or more code tables, one or more length of code word tables, one or more probability tables, information indicative of the one or more tables;

(ii) to compute from the one or more sets of indices corresponding symbols in at least one of: one or more data chunks, compressed symbols of entries in the one or more code tables, the one or more frequency tables, the one or more length of code word tables, the one or more probability tables;

(iii) to regenerate from the symbols one or more data chunks, using information from at least one of: the one or more code tables, the one or more frequency tables, the one or more length of code word tables, the one or more probability tables; and (iv) to combine and/or transform the one or more data chunks to generate the decoded data (D3).

Optionally, the decoder further includes a transcoder for transcoding the decoded data (D3) to generate corresponding transcoded data (D4) and/or generating the corresponding transcoded data (D4) from the encoded data (E2).

Optionally, the decoder is operable to regenerate the one or more tables based upon their symmetry and corresponding symmetry-indicative information provided to the decoder.

Optionally, the decoder is operable to receive at least one of the one or more tables in a manner in which the at least one of the one or more tables is storable for subsequent reuse.

Optionally, the decoder is operable to apply one or more data decompression algorithms in (iv) to generate the decoded data (D3). More optionally, in the decoder, the one or more data decompression algorithms include at least one of: Huffman decoding, VLC decoding, entropy decoding, Arithmetic decoding, Range decoding.

Optionally, the decoder is operable to combine a plurality of the one or more data chunks to generate the decoded data (D3) by employing a parallel architecture of processors for processing the plurality of data chunks in a substantially concurrent manner.

Optionally, the decoder is operable to generate the one or more sets of indices based on multiple data values that are combined together. More optionally, in the decoder, the indices are derived from one or more RGB-pixels or YUV-pixels that contain R, G and B pixel values or Y, U and V pixel values. More optionally, the decoder is operable to switch dynamically between generating the one or more data chunks either unencoded or encoded into the encoded data (E2), as a function of an achievable data decompression ratio for the data chunks when included in the encoded data (E2).

Optionally, the decoder is operable to extract from the encoded data (E2) at least one trailing bit which is indicative of if a symbol pertains to "change of code table" or to "end of data".

Optionally, the decoder is operable to generate a given data chunk substantially from only enough indices required for referencing to one or more symbols present in the given data chunk.

Optionally, the decoder is operable to decompress the one or more code tables included in the encoded data (E2). More optionally, the decoder is operable to decompress the one or more code tables by employing Huffman decoding. More optionally, in the decoder, decompression of the one or more code tables employs one or more subsidiary code tables.

Optionally, the decoder is operable to receive the one or more code tables in a manner which enables the one or more code tables to be employed in the decoder (60) for decoding subsequently sent data.

Optionally, the decoder is operable to extract from the encoded data (E2) one or more identification codes indicating from where the one or more code table are susceptible to being accessed, via one or more databases, and/or one or more proxy databases.

Optionally, the decoder is operable to decode one or more of following types of data: captured audio signals, captured video signals, captured images, text data, seismographic data, sensor signals, analog-to-digital (ADC) converted data, biomedical signal data, calendar data, economic data, mathematical data, binary data.

Optionally, the decoder is operable to receive the encoded data (E2) from a plurality of data sources, and to combine data provided from the sources to regenerate the encoded data (E2).

According to a seventh aspect, there is provided a codec which includes at least one encoder pursuant to the second aspect for encoding input data (D1) to generate corresponding encoded data (E2), and at least one decoder pursuant to the sixth aspect for decoding the encoded data (E2) to generate decoded output data (D3).

Optionally, the codec is implemented such that the at least one encoder and the at least one decoder are mutually spatially remote and mutually coupled together via a data communication network. More optionally, the codec is implemented such that the data communication network is configured in a manner of a peer-to-peer communication network. Optionally, the codec is implemented such that its encoder and its decoder are symmetrical in their processing of data therethrough; in other words, processing functions executed in the encoder are implemented as corresponding inverse functions and executed in a reverse order in the decoder.

It will be appreciated that features of the invention are susceptible to being combined in various combinations without departing from the scope of the invention as defined by the appended claims.

DESCRIPTION OF THE DIAGRAMS

Embodiments of the present disclosure will now be described, by way of example only, with reference to the following diagrams wherein.

Figure 1:
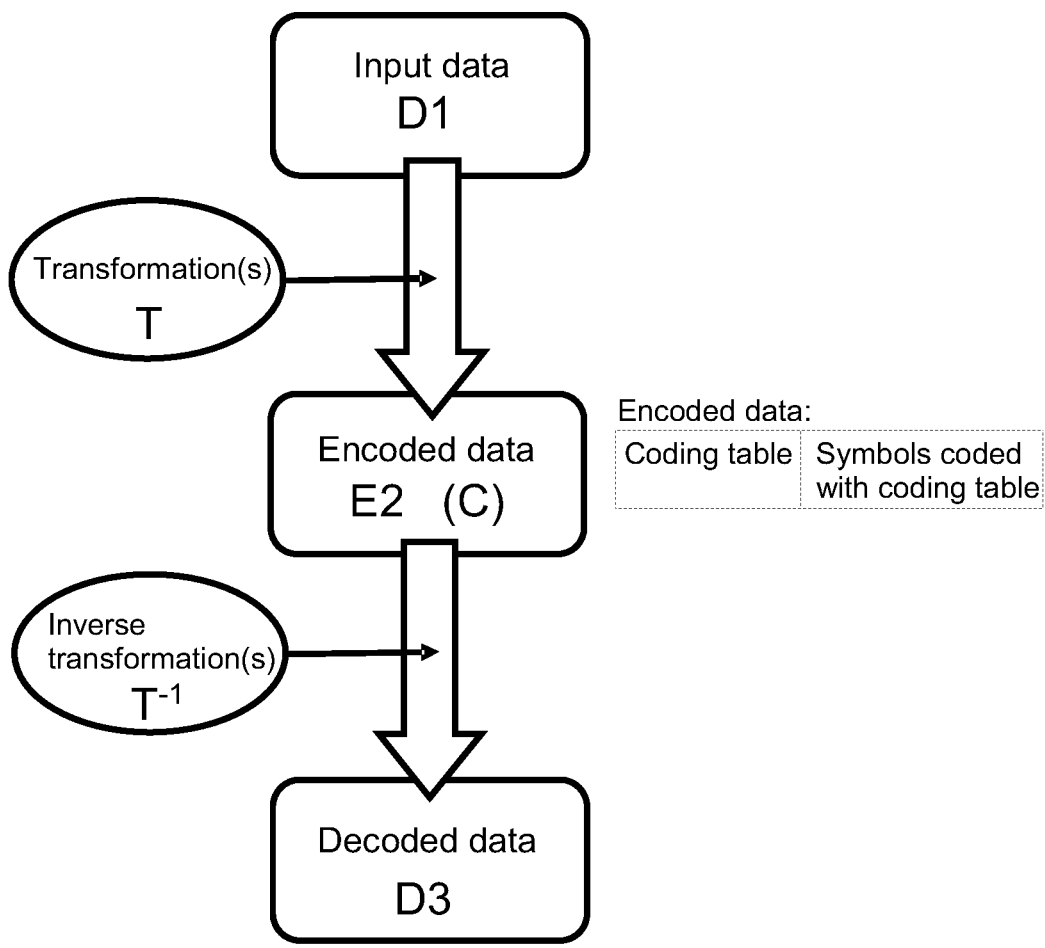
FIG. 1 is an illustration of a known encoder and a known decoder for encoding and decoding data.

In the accompanying diagrams, an underlined number is employed to represent an item over which the underlined number is positioned or an item to which the underlined number is adjacent. When a number is non-underlined and accompanied by an associated arrow, the non-underlined number is used to identify a general item at which the arrow is pointing.

DESCRIPTION OF EMBODIMENTS

In overview, the present disclosure is concerned, for example, with encoders, decoders, codecs and associated methods of operation. Moreover, embodiments of the present disclosure are capable in operation of improving delivery of code tables, frequency tables, length of code word tables, or probability tables compared with known methods. Furthermore, embodiments of the present disclosure are also capable of delivering one or more Huffman trees, in a manner which enables fewer bits to be used for delivery of the one or more tables; there is thereby provided an increase in a data compression ratio achievable during data encoding, especially when the amount of coded data accompanying the one or more tables is relatively small. Code tables, frequency tables, length of code word tables or probability tables are needed for many different entropy coding methods, for example for variable length coding (VLC) methods such as Huffman coding, Arithmetic coding, Range coding, but not limited thereto. Both encoders, for example transmitters, and decoders, for example receivers, beneficially employ methods as will be described below.

Embodiments of the disclosure described below are relevant to a world in which a volume of data being stored and communicated is increasing rapidly with a passage of time. The storage and transmission of such data consumes considerable storage capacity, transmission bandwidth and energy. Most of the data in the world is captured audio signals, captured video signals, captured images, text data, seismographic data, sensor signal data, analog-to-digital (ADC) converted data, biomedical signal data, calendar data, economic data, mathematical data, binary data but not limited thereto. Embodiments of the disclosure are operable to reduce an amount of encoded data for all the aforementioned data types, and also for other types of data; there is thereby enabled efficient delivery of code tables, frequency tables, length of code word tables or probability tables, thus enabling use of smaller data chunks that reduce the entropy of the data efficiently, namely size of the data efficiently.

Moreover, smaller data chunks can be effectively handled via parallel processes to output results faster, and such parallelism is common in modern microprocessor architecture, especially in future configurations of microprocessors, for example data processor arrays and high speed configurations of RISC (reduced instruction set computer) processors.

For a given encoding method, a corresponding code table includes information indicative of lengths of code words, for example expressed in bits, codes for representing the code words, and indices (namely "indexes") of the code words. The code table can also be generated from the lengths of the code words. The indices (namely "indexes") of the code words represent the values of corresponding original symbols that are coded with the code words. Similarly, the frequency table contains frequencies of occurrence of the symbols and the indices of the symbol. The indices of the symbols represent the values of the original symbols coded by the indices respectively. The frequency table can be converted to a probability table and the probability table can be used as a rough estimate of the frequency table. The conversion between the frequency table and the length of code words and vice versa can also be done.

When any of the aforementioned tables are delivered, one very important parameter in such delivery is the maximum index of the table. The maximum index of the table represents how many different symbols, or how many possible different symbols, are available in the delivered table, and also in the input data. For example, if given data is:

4, 3, 0, 1, 0, 4, 3, 4, then the real maximum index is 4, and the minimum index is 0, which means that there are potentially 5 (max−min+1=4−0+1) different symbols (0, 1, 2, 3, 4) present in the data. On account of there actually being only 4 different symbols (0, 1, 3, 4) present in the data, the table is optionally also delivered by using '3' as the maximum index, namely a count of available different symbols, instead of '4', namely possible different symbols. When the value 3 is used for the maximum index value of the table, then some other mechanism is required for delivering the information concerning which symbols are used for each table indices.

When the symbols are in order, there is optionally delivered the real maximum index (4) and availability bits, for example, 11011 in this example case. Such delivery maps so that the table index 0=symbol 0 that is marked as index, and an associated symbol pair will then be (0, 0). Similarly, a remainder of the index and symbol pairs are (1, 1), (2, 3) and (3, 4). It is also optionally possible to use index and symbol pairs directly for defining the used indices for different table indices, and then to deliver the maximum index of table as '3'. This is a very valuable method, for example when the symbols in the delivered table are sorted based upon their frequencies.

For example, in this case above, index and symbol pairs are, for example, (0, 4), (1, 0), (2, 3), and (3, 1). Sometimes, the used index and symbol pairs are predefined, whereas at other times the index of the used symbol and index pair table are delivered, In another different situation, the index and symbol pairs are delivered together with the encoded data (E2). In yet another different situation, the decoder 60 is operable to retrieve the used index and symbol pairs from a known location; in still another different situation, the decoder 60 is operable to retrieve the used index and symbol pairs from the location whose corresponding location information was delivered together with the encoded data (E2).

In some situations, it is advantageous to approximate the table to be delivered with the help of symmetry. Utilizing symmetry makes it possible to deliver the coding table being used with a smaller data size than delivering an entire table would require, without regard to whether or not the table is based on code lengths, on probabilities or on frequencies of occurrence. Moreover, it is faster to generate a symmetrical table both in the encoder 50 and in the decoder 60, because it contains less elements, namely fewer symbols. However, using symmetry makes the table slightly sub-optimal, but the savings gained in delivered table data size compensates for that loss entirely or more, especially if the amount of data being sent is reasonably small.

In the latest example above, symmetry is optionally utilized in delivering the table, because a symbol value '0' is more probable than '1' and correspondingly, a symbol value '4' is more probable than '3'. Moreover, the probabilities of symbol values '0' and '4' are close to one another, and correspondingly, the probabilities of symbol values '1' and '3' are also close to one another. However, the value '2' does not occur at all in the data, so therefore it is a most improbable value, regardless from which direction it is inspected.

In cases when symmetry is utilized, a coding table can thus always be generated based on the sums of occurrences of symmetrically corresponding elements. In such a case, there are altogether 5 occurrences of symbol value '0' and '4', and correspondingly, there are altogether 3 occurrences of symbol value '1' and '3'. The element '2' does not occur at all in the data, and therefore it does not necessarily need to be given its own symbol. However, in some situations, a symbol can be generated for element '2' as well, and in that case it would be included in both the right hand table and the left hand table, when symmetry is utilized.

Thus, a range coding table is optionally generated in such a way that the counts of occurrences for the ranges would be 5, 3 and (0), and thus the range table being used would be 5, 3, 0, 3, 5 for symbols zero to four, even though the optimal frequency-of-occurrence—based range table of course would be 3, 2, 0, 1, 2, which then would require the delivery of four values for frequency of occurrence, as compared with an optional implementation described above that is based on symmetry, where only two values for frequency of occurrence need to be sent, namely delivered.

This same idea based on symmetry is optionally used with other coding methods such as Huffman coding, and in that case, a symmetry-based table would be, for example, a table wherein left hand values receive the code '0' and right hand table values receive the code value '1'. Thus, the Huffman code words would be, for example, 01, 00, does-not-exist, 10, 11. Alternatively, if it is desired to reserve an option for the value '2' to exist in future, then the codes would be 01, 001, 000/100, 101, 11. In this implementation, in principle, only two code lengths would need to be sent/delivered (1 and 1), or else three code lengths (1, 2, 2), and the table being used would be entirely recoverable in the decoder 60 in cases when it is known that the table is utilizing symmetry. In longer tables, the advantages would be even more distinctly observable.

It will be appreciated that the piece of information on whether the table is utilizing symmetry or not, is optionally already known previously, or else it is transmitted/delivered in the same manner as the piece of information on whether an optimal table or a predefined table is being used, or a table that was generated dynamically from previous tables. The delivery of the piece of information on whether or not the table is utilizing symmetry is executed by sending the index of the table being used to the decoder 60.

For example:
(i) a table index '0' means that the table is sent/delivered in its entirety;
(ii) a table index '1' means that the table is symmetrical and that only a half of it will be delivered;
(iii) table indices 2 to 63 mean that a pre-defined table is being used; and
(iv) table indices 64 to 127 mean that a previously delivered and stored dynamic table is being used.

It will be appreciated that the symmetric tables can also be utilized as predefined or as dynamically stored tables.

Optionally, various coding methods are used, for example, with ODelta coding or without it, wherein ODelta coding involves coding data differentially into a sequence of 0 and 1 values and employing a counting wraparound. Moreover, when utilizing these various coding methods, it is advantageous to employ them in combination with the table index of the table being used, also to optionally express whether the ODelta method has been executed on the data before coding or not, and also whether or not the decoder 60 must then correspondingly execute the inverse operation after decoding.

In such a case, for example the table indices are otherwise the same, but the value $128_{dec}$ is added to indicate that ODelta has been used. If this insertion has not been performed, then ODelta has not been executed on the data before coding. Of course, optionally, other values can be also added to the table index value; however, it will be essentially appreciated that a table index expresses which kind of table is being used, and which kinds of additional data are transmitted/delivered with the table index, together with encoded data.

Figure 2:
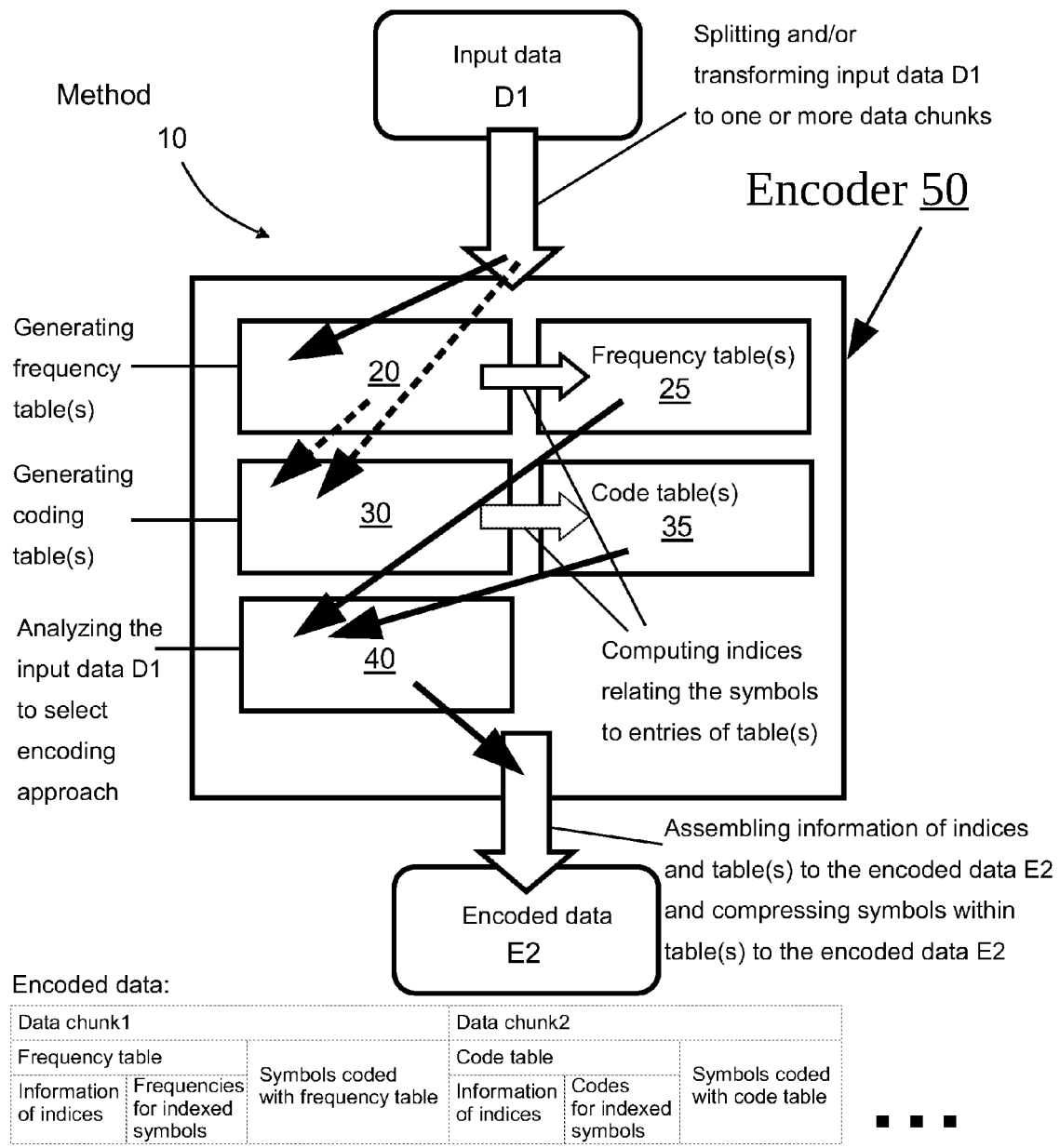
FIG. 2 is an illustration of a method of encoding data pursuant to an embodiment of the present disclosure.
Figure 3A:
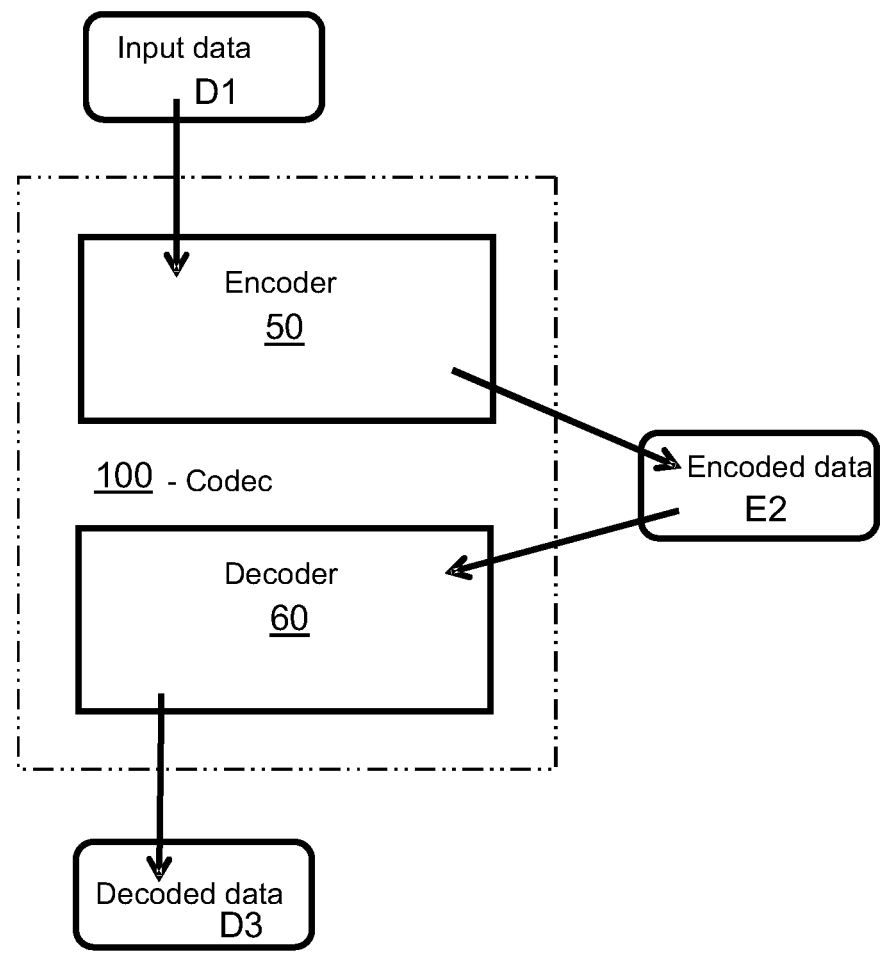
FIG. 3A is an illustration of an embodiment of an encoder and a decoder, collectively a codec, pursuant to the present disclosure.

Referring to FIG. 2 and FIG. 3A, there is provided an illustration of steps of a method of encoding input data D1 to generate corresponding encoded output data E2; the steps of the method are indicated generally by 10, and optionally employ one or more of: a step 20 of generating one or more frequency tables 25, a step 30 of generating one or more coding tables 35, a step 40 of analyzing the input data D1 to select a most suitable encoding approach, but not limited thereto. When implementing such a method 10 of encoding the input data D1, there has to be some mechanism available that changes one or more symbols present in the input data D1 to corresponding indices (namely "indexes"); for example, a given index included in the indices is equal to a pixel value, for example in a pixel array image. The index can also be equal to the pixel value minus a smallest pixel value present in the pixel array image. In such a situation, the method also needs to deliver the smallest pixel value in the encoded output data E2, namely to be delivered somehow from an encoder 50 to a corresponding decoder 60 by employing the method 10, or by employing an inverse thereof, because otherwise the decoder 60 is not able to decode a corresponding given symbol back to its original value via use of its given index. The index can also be created from multiple information, for example via one or more of discrete cosine transforms (DCTs), individual AC coefficients containing absolute AC coefficient values, signs of the AC coefficient, run of the zero AC coefficients between it and a previous non-zero AC/DC coefficient, and an indication flag that represents information pertaining to the current AC coefficient, and a last non-zero AC coefficient. The index is also susceptible to being created based on multiple pixel values that are combined together, for example a 24-bit RGB-pixel that contains 8-bit R, G and B pixel values or a 10-bit value that contains two 5-bit Y pixel values.

Figure 3B:
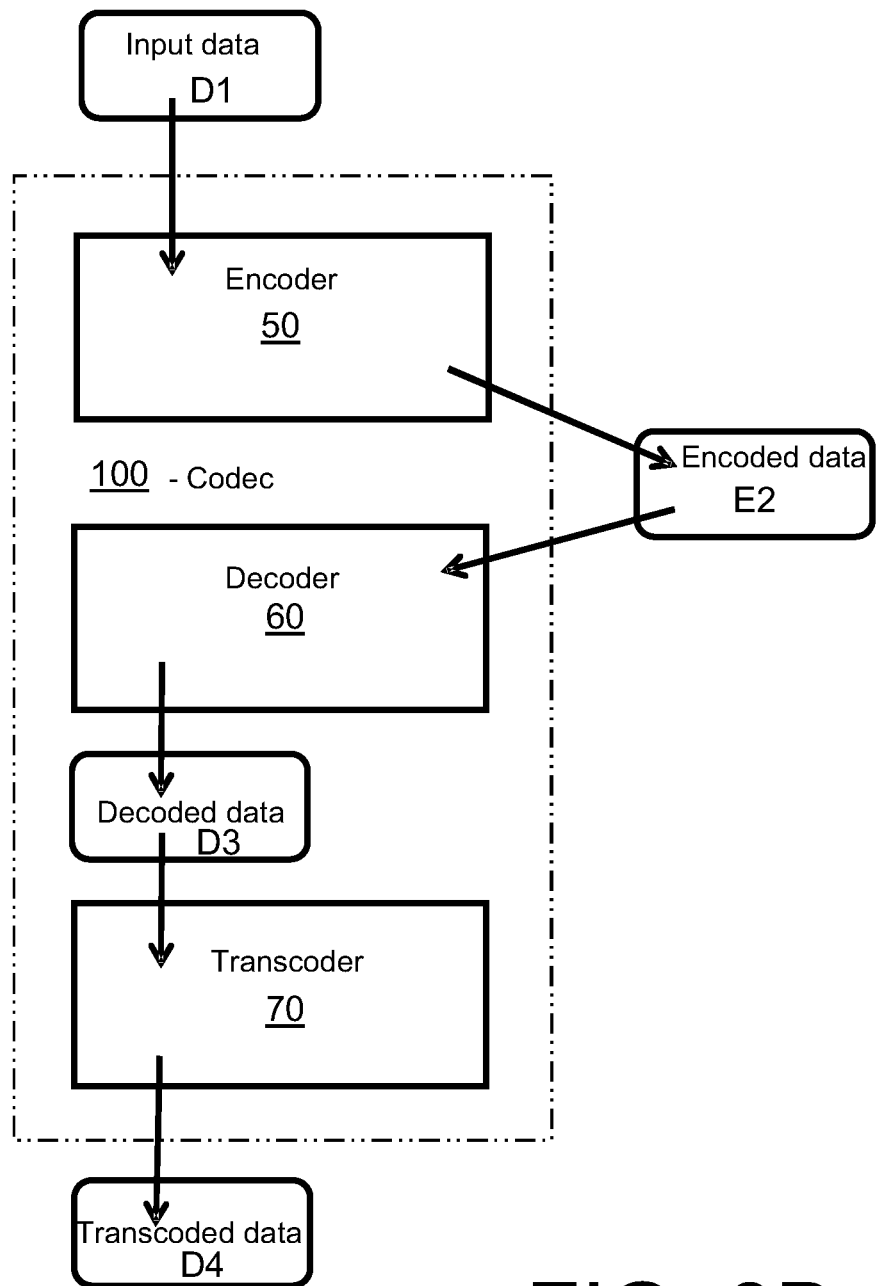
FIG. 3B is an illustration of an alternative embodiment of an encoder and a decoder, collectively a codec, pursuant to the present disclosure, wherein decoded data D3 in the decoder is transcoded to generate transcoded data D4.

Referring to FIG. 3B, transcoding of the data D3 in the decoder 60 to generate corresponding transcoded data D4 is optionally implemented via a transcoder 70, for example in a multicasting situation wherein;
(i) there are multiple devices, each device hosting a decoder 60 for receiving the encoded data E2;
(ii) at least some of the multiple devices are mutually different, and have associated mutually different output formats, for example display screen layout, resolution, aspect ratio, display screen driver buffer capacity, and so forth.

Transcoding of the data D3 is required to generate the corresponding data D4 which can be handled in a compatible manner by hardware and/or supporting software layers of the devices; the devices are optionally based upon computing hardware, for example smart phones, specialist scientific equipment, televisions, hifi apparatus, videoconferencing apparatus and similar. The transcoder 70 is implemented in software and/or in dedicated data processing hardware, for example an ASIC.

As mentioned below, when implementing the method 10, there always has to be included a step that changes one or more symbol values to one or more corresponding indices, and this step, or an inverse thereof, has to be communicated to the decoder 60 or otherwise they have to be preset both for the encoder 50 and for the decoder 60. An easiest approach to achieve such communication is to employ a direct relationship between a given symbol value and its corresponding index value, for example an index value is equal to a corresponding pixel value, or the index value is the number that is based from the bits representing S=sign flag, V=10-bit coefficient value, R=6-bit nonzero run value, and L=last flag, for example as represented by:

S V V V V V V V V V V R R R R R L

It is not always possible to use a direct relationship for multiple reasons, for example, when a direct relationship is employed:

(a) it is impossible or inefficient to encode or decode data, indices (namely "indexes"), frequencies, probabilities or lengths of symbols;

(b) an amount of different indexes is huge; or (c) all symbols do not have frequency information available and for that reason some algorithms are not able to generate codes for those symbols.

Some of such issues (a) to (c) can be, at least partially, solved by using escape codes or using some logic that generates frequency information for all symbols. Quite often, it is still beneficial to use some other approach to convert symbols to indices (also known as "indexes"). One approach involves always ensuring that there is some look-up-table (LUT) that specifies indexes that are used for available symbols; here, the escape code is very beneficial for reducing the size of encoding tables. This LUT has to be available in the encoder 50 and in the decoder 60, or it has to be delivered from the encoder 50 to the decoder 60, or vice versa. When more optimal coding is needed to enable better compression to be achieved, there are beneficially employed multiple tables that can be selected based on the index of available LUT's. However, this is sometimes not practical, because the frequency, or length of code word, combinations are so huge that there is no sense to store all the different tables in data memory, or the delivery of such LUT's requires too much data to be communicated between the encoder 50 and the decoder 60. Thus, methods 10 pursuant to the present disclosure enable efficient transmission of frequencies, length of code words, or probabilities from the encoder 50 to the decoder 60 to be achieved using suitable symbols to index one or more transformations. It is always beneficial to use length of code words instead of the frequencies, if the coding method is not able to utilize more accurate information provided by way of frequency information, for example VLC coding methods are not able to utilize frequency information, but conversely Arithmetic coding and Range coding are capable of utilizing frequency or probability information.

An example of an embodiment of the disclosure will now be described in greater detail, wherein there is employed length of code words for encoding purposes; however, a corresponding embodiment which employs frequency information or probability information is also feasible.

In the encoded data E2, see FIG. 2, for example an encoded data stream, there is included data values that can contain 20 symbols, namely values from 0 to 19, but only 8 data values, namely minimum value=2 and maximum value=19, of them are actually available in the current data stream. These minimum and maximum values are optionally also delivered separately as described later to enable more savings in table delivery to be achieved. Corresponding frequencies, wherein sum=148, length of code words has a minimum length=1 and a maximum length=6, and indices ("indexes") for the symbols are, for example, based on Table 1 below, it can be determined, without compressing these symbols, that there are required 148*5 bits=740 bits to convey the bit stream.

TABLE 1

Example bit stream encoding

| Value | Frequency | CWLen | Freq1 (bits) | Frequency2 | Freq3 (bits) | Index1 | Index2 |
|---|---|---|---|---|---|---|---|
| 2  | 7  | 4 | 4 (4)  | 84  | 128 (4)  | 2  | 0 |
| 4  | 2  | 6 | 1 (6)  | 24  | 32 (6)   | 4  | 1 |
| 7  | 81 | 1 | 32 (1) | 972 | 1024 (1) | 7  | 2 |
| 9  | 1  | 6 | 1 (6)  | 12  | 16 (7)   | 9  | 3 |
| 12 | 35 | 2 | 16 (2) | 420 | 512 (2)  | 12 | 4 |
| 13 | 9  | 4 | 4 (4)  | 108 | 128 (4)  | 13 | 5 |
| 14 | 5  | 5 | 2 (5)  | 60  | 64 (5)   | 14 | 6 |
| 19 | 8  | 4 | 4 (4)  | 96  | 128 (4)  | 19 | 7 |

For a coding regime as presented in Table 1, if there is not a suitable frequency table or code table available, for example predefined or specifiable by way of a reference index, in the encoder 50 and in the decoder 60, then there are several methods which are potentially available for sending these needed code words, namely lengths and codes, from the encoder 50 to the decoder 60.

A first example method modifies the frequencies of the data and then generates a corresponding code table, wherein a least probable symbol, namely longest code word, is allocated one additional bit and all symbols that are not available in the data are allocated such long lengths of code word that they do not effect the coding, but enables the encoder 50 and the decoder 60 to create a mutually similar frequency table and a mutually similar Huffman tree. On account of there being 12 missing symbols, such frequency modification can be implemented, for example, by multiplying the original frequencies by 12 and setting a frequency value of 1 for all the symbols that do not have any real frequency value, namely frequency value=0. The modified frequency values can be seen, for example, from the Frequency2 column of Table 1 for all the symbols that have frequencies available. Based on these new frequencies, the lengths of code words for all 20 symbols can be created as:

11, 11, 4, 11, 6, 11, 11, 1, 11, 7, 11, 11, 2, 4, 5, 10, 10, 10, 10, 4

Using this kind of code table, there are (7*4+2*6+81*1+1*7+35*2+9*4+5*5+8*4=) 291 bits needed for delivering the coded symbols from the encoder 50 to the decoder 60. For correct data encoding and subsequent data decoding, the encoder 50 and the decoder 60 have to use similar frequencies, wherein such frequencies can be created based on these new lengths of code words and the result can be seen from column Freq3 ($=2^{(maxbitlen-bitlen)}$) for symbols that have frequency; "maxbitlen" is an abbreviation for "maximum bit length", and "bitlen" is an abbreviation for "bit length". Other symbols are allocated frequencies 2 (bitlen=10) or 1 (bitlen=11).

This first method enables the generation of a code table that contains all possible symbols, namely 20 symbols in the aforementioned example; it is beneficial when the same code table is used also for other similar types of data. Such kind of lengths can also be optionally compressed with any compression method, without any additional information and so the code table is easy to be delivered between the encoder 50 and the decoder 60 in potentially all situations. For example, without compression, this code table requires 4 bits for representing all length of code words=>20 length*4 bits/length=80 bits.

This first method has an inefficiency, compared to optimal Huffman codes, of only 1 bit for every least probable symbol, namely=1 bit in this first example method. Additionally, there are also those bits that are needed for compressing and delivering the lengths of code words, namely code table, from the encoder 50 to the decoder 60. Number 20, namely the number of all possible symbols, is optionally delivered, or it may also be known by the decoder 60.

Next, a second example method will be described to illustrate an alternative embodiment of the present invention. The second method generates the lengths of the code words only for the symbols that are available, namely for those symbols that have a frequency value >0. An index used for Huffman code table generation is index2 (see Table 1), but the index that has to be delivered from the encoder 50 to the decoder 60 is index1, namely=symbol value (see Table 1). Such generated lengths of code words can be seen from column CWLen (see Table 1). Using this kind of code table, there are (7*4+2*6+81*1+1*6+35*2+9*4+5*5+8*4=) 290 bits needed for delivering the coded symbols. Based on these lengths of code words, the encoder 50 and the decoder 60 are operable to create a frequency table seen in column "Freq1" of Table 1.

The first delivery method for this kind of code table delivers the length of code word and the index of the code word as a pairs of numbers as follows:

(2, 4), (4, 6), (7, 1), (9, 6), (12, 2), (13, 4), (14, 5), (19, 4)
wherein the pairs are denoted by brackets.

Such a delivery method requires 5 bits for every index and 3 bits for every length of code word=>8 bits for every pair and 8*8=64 bits in total.

These indices (namely "indexes") can also be delta encoded and then the pairs are as follows:

(2, 4), (2, 6), (3, 1), (2, 6), (3, 2), (1, 4), (1, 5), (5, 4)

Now, it will be appreciated that only 3 bits for every index and 3 bits for every length of code word is needed=>6 bits for every pair and 8*6 bits=48 bits to convey the code table.

These index and lengths of code word values are beneficially separated to own corresponding data streams that often enable improved compression to be achieved in comparison to combined 8- or 6-bit values. The streams are now:

2, 4, 7, 9, 12, 13, 14, 19
and
4, 6, 1, 6, 2, 4, 5, 4
⇨ 8*5 bits+8*3 bits=64 bits in total.

When indices ("indexes") of a first stream are delta coded, there is thereby generated:

2, 2, 3, 2, 3, 1, 1, 5
and
4, 6, 1, 6, 2, 4, 5, 4
⇨ 8*3 bits+8*3 bits=48 bits in total.

This is a best, namely optimal, delivery method, when an amount of possible symbols is high, but when the data contains only a few mutually different symbols.

All these aforementioned data streams can be compressed and delivered from the encoder 50 to the decoder 60, when in operation. There is no inefficiency associated with this method compared to optimal Huffman codes, but this method of the disclosure still consumes considerable bits to deliver those streams containing information of indices (namely "indexes") and lengths of code words. The value 8, namely=number of available symbols, has to be delivered also, because otherwise the decoder 60 is not able to ascertain how many values or pairs should be decoded to the code table. In this case, a number 20, namely number of all possible symbols, does not need to be delivered between the encoder 50 and the decoder 60.

Some of the methods described in the foregoing are susceptible to being employed in combination for achieving especially favourable encoding of the input data D1 in the encoder 50 to generate the corresponding encoded data E2, likewise an inverse thereof at the decoder 60. Optionally, all these solutions create the Huffman codes only for the symbols that are available, for example in a manner akin to the second method. Moreover, the frequency table generated from these data lengths can be seen in column Freq1 (see Table 1).

In comparison to the first method, the second method is also able to set the length of the code word to zero, when it is not available, but it is still necessary to deliver such information from the encoder 50 to the decoder 60; this is possible to implement due to a fact that a real length of a code word can never be zero. This causes following stream of lengths:

0, 0, 4, 0, 6, 0, 0, 1, 0, 6, 0, 0, 2, 4, 5, 0, 0, 0, 0, 4 which only requires originally 3 bits for all the length of the code words=>20*3 bits=60 bits.

These types of lengths can also be compressed with any compression method without any additional information and so the code table is easy to be delivered between the encoder 50 and the decoder 60 in all situations. Moreover, this data also often contains numerous zero values and so it can be easily compressed, for example by using VLC or RLE. A number 20, namely a number of all possible symbols, is optionally delivered from the encoder 50 to the decoder 60, or it is known a priori by the decoder 60.

Another embodiment uses bits to specify which data symbols are available and which are not. In a situation where there are generated two data streams, wherein a first stream contains bits and a second contains lengths of the code words as follows:

0, 0, 1, 0, 1, 0, 0, 1, 0, 1, 0, 0, 1, 1, 1, 0, 0, 0, 0, 1
and
4, 6, 1, 6, 2, 4, 5, 4 there is required 1 bit for every symbol and 3 bits for every length of available code word=>20*1 bits+8*3 bits=44 bits in total. This is usually a best, namely optimal, delivery method.

Such streams are further compressible by utilizing an entropy modifier (EM) and/or VLC. As aforementioned, the number 20, namely the number of all possible symbols, is optionally delivered between the encoder 50 and the decoder 60, or it is supplied a priori to the decoder 60. Moreover, the number 8, namely the number of available symbols, does not need to be delivered between the encoder 50 and the decoder 60, because it can be calculated from the bits that have a value 1.

For all the previous described methods pursuant to the present disclosure, the encoder 50 and the decoder 60 have to possess information regarding how many different symbols can be used, for example 20 symbols in the aforesaid example, or how many different symbols are available, for example 8 in the aforesaid example. If the value, namely the number of different symbols, is not available in the decoder 60, it has to be delivered to the decoder 60. Optionally, some data can be saved in a table which is delivered by sending small amounts of additional information to specify a range in which the data values are available, for example, it is feasible to deliver values 2 (minimum) and 19 (maximum) to specify a range in which values are to be included. In this example, such delivery often uses more bits than it saves, but in a situation where, for example, 8-bit pixels contain only values from 60 to 200, the saving in bits to be communicated from the encoder 50 to the decoder 60 is remarkable. The delivery of such a range enables that all the bits or values that are otherwise used for smaller than the smallest value and bigger than the biggest value do not need to be delivered from the encoder 50 to the decoder 60. Moreover, it will be appreciated that, when the range is delivered from the encoder 50 to the decoder 60, there is no need to deliver the first and the last index value in a situation wherein the index values otherwise were sent with or without delta encoding. The same applies also for the first and the last value 1 bits in the last example. The delivery of minimum and maximum values is optionally also utilized when employing other methods, for example ODelta coding, a method disclosed in patent application GB1303661.1, filed on 1$^{st}$ March, 2013 by Gurulogic Microsystems Oy, hereby incorporated by reference. A best advantage of delivering minimum and maximum values is achieved when all the methods modifying entropy and implementing entropy coding use the same information and that is delivered only once.

The methods as described in the foregoing are optionally employed selectively, for example in response to how many symbols are to be encoded in a given data chunk, for example divided from a total body of data to be communicated from the encoder 50 to the decoder 60. Thus, the selection of the previously elucidated methods depends on how many different symbols are available, how many of them are really used, what is the frequency of the least probable symbol, and how indices (namely "indexes") of available symbols are distributed through the possible symbols.

The scaled probabilities can also be calculated for the symbols shown in Table 1 based on the frequency values. The number of symbols is, for example, 148. The scaled probabilities in this example are beneficially calculated by using two different probability multipliers, namely 256 and 32. Using the probability multiplier 256 for the first symbol, there is therefrom calculated the scaled probability value as Round(256*7/148)=12, wherein "Round" is an integer rounding-up function. All the calculated scaled probability values with multiplier 256 are thus as follows:

12, 3, 140, 2, 61, 16, 9, 14

The sum of the scaled probability values is 257, namely >256, and it is beneficial to reduce some value by 1. Such a reduction is beneficially implemented in order to cause as little effect as possible to the actual coding. For example, in this case, the value 2, namely the smallest value, can be reduced to a value 1, or the value 9, namely the smallest rounded up value, can correspondingly be reduced to a value 8, so that the scaled probability values with multiplier 256 for Range coding or for Arithmetic coding are as follows:

12, 3, 140, 1, 61, 16, 9, 14 (sum=256=probability multiplier).

The delivery of scaled probabilities (with multiplier 256) can be made as follows:

0, 0, 1, 0, 1, 0, 0, 1, 0, 1, 0, 0, 1, 1, 1, 0, 0, 0, 0, 1
and
12, 3, 140, 1, 61, 16, 9, 14

When the probability multiplier value is 32, then the scaled probability values are as follows:

2, 0, 18, 0, 8, 2, 1, 2 and after sum equalization as follows:

1, 0, 18, 0, 8, 2, 1, 2

Now, it will be appreciated that a zero value is calculated for some of the scaled probability values. This means that those values must be delivered, for example, by using an escape symbol. The scaled probability for the escape symbol needs to be calculated, and it may not be smaller than the value 1. In this case, it gets allocated a value 1, because Round (32*(2+1)/148)=1. Now, this escape symbol has to be added to the other symbols and the new set of symbols is then: "escape", 2, 7, 12, 13, 14, and 19. Those new symbols are beneficially allocated indexes in a range from 0 to 6. The scaled probabilities for the new symbols, when the probability of the escape symbol is reduced from the one or more other symbols, for Range coding or Arithmetic coding are as follows:

1 and 1, 18, 8, 2, 1, 1 (sum=32=probability multiplier).

The delivery of scaled probabilities (with multiplier 32 and escape code) can be made as follows:

0, 0, 1, 0, 0, 0, 0, 1, 0, 0, 0, 0, 1, 1, 1, 0, 0, 0, 0, 1
and
1, 1, 18, 8, 2, 1, 1

It will be appreciated that the first symbol is the escape symbol and bits specify the other symbol values.

When the escape symbol is defined, this table can be better used also in the future, as aforementioned. Now, also the symbols that were not present in this data can be delivered using the escape symbol, if they will be present in the future data.

Utilization of escape codes with range encoding are presented in another patent application by the Applicant Gurulogic Microsystems Oy, Title: "*Encoder, decoder and method*" filed on 20 Feb. 2014 with application number GB1403038.1, hereby incorporated by reference.

As mentioned above in the explanation of Table 1, it is optionally also possible to use a predefined table or a table described by an index instead of the delivered table, when the data D1 is encoded in the encoder 50, and subsequently decoded in the decoder 60. This means that the used code, frequency, probability or code length table is known beforehand by the encoder 50 and by the decoder 60, or the table is selected from a limited set of alternative tables, and the encoder 50 delivers the selection to the decoder 60. The predefined table is optionally available locally to the decoder 60.

The table can be previously stored based on the delivered parameter, for example an index of the table and/or a maximum index of the table. Alternatively, the table can be generated with an algorithm implemented in an initialization function or with an algorithm in the previously stored table; such creation, namely generation, of the table, is also based on the delivered parameters, for example on an index of the table and/or on the maximum index of the table and/or on the minimum index of the table. Instead of a previously stored table, it is also optionally possible to use a table that was delivered earlier during the data encoding of the data D1 to generate the encoded data E2.

For example, when VLC coding is used, typically the length of codes are stored earlier for different table indices, and the code table can be generated based on those length values by using the full table or by using only a part of the table values. The used part can be defined based on the delivered table parameters or based on the table index. Similarly, when range coding is used, typically the probability table is generated based on the form of the table, for example delivered via use of a table index, and the length of the table, for example delivered as a maximum index of the table.

There will now be described another example method of the disclosure that enables efficient code delivery without using a separate escape symbol, while still enabling all the symbols to be coded very efficiently for a current given data chunk and for future data chunks that have slightly different symbol frequencies. This other method can be implemented so that all the symbols, namely those which have values available as well as those which do not have values available, will be allocated at least the value one as the scaled probability. If the scaled probability value is 1, then the availability bit will be equal to 0, and for the other scaled probability values the availability bit will be equal to 1. The scaled probability value then needs to be delivered only for the symbols whose availability bit is equal to 1. Details of the method can be found in the patent application by the Applicant Gurulogic Microsystems Oy, namely GB1403038.1, hereby incorporated by reference, but the table delivery in the previous example above is then as follows:

0, 0, 0, 0, 0, 0, 0, 1, 0, 0, 0, 0, 1, 0, 0, 0, 0, 0, 0, 0 and 10, 4 (sum=18*1+10+4=32=probability multiplier).

This example now shows an advantageous solution, which yields quite similar performance with Range coding than can be achieved with Huffman coding for encoding the entropy of data. Such a solution is able to deliver code probability tables very efficiently. With other types of data, or with other types of probability multiplier values, this solution is clearly, in many situations, a best, namely optimal, coding method to employ. For that reason, the delivery of its code table is herewith described in greater detail.

Optionally, the encoder 50 and the decoder 60 can store all the tables, in a static manner or a dynamically updatable manner, which are to be utilized by the encoder 50 and the decoder 60. If the tables are stored, they are beneficially identified in data sent from the encoder 50 to the decoder 60 by way of an index which uniquely identifies its corresponding stored table. Such indexing of tables potentially enables a huge saving of overhead data otherwise required to sent for delivering a code table from the encoder 50 to the decoder 60.

The utilization of the previously stored table can be appreciated, for example, in a following example. For the delivered table, the last probability table presented in the previous example, namely 1, 1, 1, 1, 1, 1, 1, 10, 1, 1, 1, 1, 4, 1, 1, 1, 1, 1, 1, 1, is selected to be added for reuse purposes; for such purpose, the table is allocated an index value of, for example, "17". Now a new data chunk is needed to be encoded and it has symbol values and frequencies as provided in Table 2.

TABLE 2

Example with second symbol values and frequencies for table reuse

| Value | Frequency |
|---|---|
| 1 | 3 |
| 5 | 1 |
| 7 | 68 |
| 8 | 1 |
| 10 | 4 |
| 12 | 32 |
| 14 | 3 |
| 18 | 1 |

Now all the available probability tables for Range encoding can be evaluated from Table 2, and it is very probable that the table 17 is selected to be the best probability table to be used for delivering this new data from the encoder 50 to the decoder 60 with Range coding. At least, it is easy to see that the delivery of a new probability table requires a lot more data than the amount of additional data that the table 17 creates over the ideal entropy encoding result. For that reason, table 17, or some other probability table, can be reused instead of needing to deliver a new better optimized probability table. When a table is reused, its index 17 is delivered from the encoder 50 to the decoder 60, and after that, Range coding values can be delivered from the encoder 50 to the decoder 60. When a table cannot be reused, then a value, for example 0 or a next free table index, that defines a new table delivery is first delivered from the encoder 50 to the decoder 60, and then the table is also delivered from the encoder 50 to the decoder 60, and after that, the Range coding values can be delivered from the encoder 50 to the decoder 60. Often, the amount of coded symbols also needs to be delivered, for example typically before Range encoded data, which enables proper decoding of data in the decoder 60.

Optionally, it is also possible to modify the code table that is already in use and only send the changes therein, thus resulting to a new code table. Further optionally, the already delivered code table can be used in adaptive manner after delivering/receipt.

Optionally, the encoder 50 and the decoder 60 are operable to create similar full tables that also enable coding of other symbols for future use of similar types of data, where the currently missing symbols might be present. These tables can be stored and provided with a new code table index. It is possible to store both types of tables, namely one without fulfill and another with fulfill. Moreover, it is also possible to store only the original table and, when it is needed next time with fulfill property, it can then be indicated separately in a communication from the encoder 50 to the decoder 60. A solution that stores fulfilled tables is more preferable, because it simplifies decision-making and does not require any additional indication to be delivered indicative of whether or not the table needed is fulfilled. The fulfill of the table can be also implemented such that the table containing all the values is filled with frequencies decreasing from, for example, 4 to 1 so that the next symbols will be allocated relatively shorter symbols and the last symbols will be allocated relatively longer symbols. By employing such an approach, the order of symbols corresponds to an order of available symbols in a future stream of data.

In the examples described in the foregoing, delivery of lengths of code words and delivery of scaled probabilities are beneficially employed, although similar techniques can also be used for delivering frequency values needed for Huffman coding, Arithmetic coding or Range coding. Beneficially, a best coding method to employ uses least bits when the encoded data is added with the overhead information that is needed to deliver the code table, the length of code words, the probability table or the frequency table, thereby enabling, for example, smaller portions of data to be sent from the encoder 50 to the decoder 60 using encoding methods specifically optimized for a nature and/or data type of content included in the smaller portions of data, namely data chunks. For such reasons, the best result with Arithmetic coding and Range coding can be achieved when the frequency values are quantized, at least to a limited extent, so that the frequency table presents nearly correct values that can be delivered with clearly less amount of bits than the exact table and so the optimality is only slightly reduced from the coding of symbols, for example when employing entropy coding. Moreover, delivery of scaled probability tables enables very efficient and nearly optimal Range coding and Arithmetic coding implementations to be realized.

When there is only a small amount of data to be communicated from the encoder 50 to the decoder 60, it is typically better to communicate the data without substantially employing any form of encoding. However, when the amount of data increases, then it is beneficial to employ Huffman coding with approximately correct lengths of code words. As a volume of data that is to be communicated from the encoder 50 to the decoder 60 increases, progressively more benefit is derived from using more accurate code tables. Moreover, when there is a considerable amount of data to be Arithmetically coded or Range coded, best coding results are obtained when more efficient entropy coding is employed; there is thereby gained a coding advantage over the bits needed for delivering a frequency or a probability relative to the bits needed for delivering a code table. Delivering an index of a probability table, a frequency table, length of code word tables, or a code table is always similar, and when an index is used, the method that has the best table available enables a best compression performance to be achieved, A selection of the coding method used has also to be delivered from the encoder 50 to the decoder 60, if it is not fixed based on the data or based on the amount of data.

The encoder 50 and the decoder 60 collectively form a codec 100. In a practical situation, there may be one encoder 50 and one or more decoders 60, for example in a situation where the encoder 50 generates the encoded data E2 which is broadcast widely to numerous decoders 60, namely "multicasting", for example via wireless, optical fibre communication network and similar. Moreover, situations can arise, for example in a peer-to-peer data communication network, wherein a decoder 60 sources its encoded data E2 from several encoders 50 coupled within the peer-to-peer network, where the encoded data E2 is supplied in separately encoded data chunks which are collected together at the decoder 60; such a configuration is beneficial because certain portions of the encoded data E2 can be sourced more locally to the decoder 60 which eases data load on long-distance data communication network links employed for implementing such peer-to-peer networks. The encoder 50 and the decoder 60 are susceptible to being implemented in dedicated digital hardware, in computing hardware which is operable to execute one or more software products recorded on non-transitory data storage media, or a combination thereof. The encoder 50 and decoder 60 are useable in audio recording and/or playback apparatus, in video recording and/or playback apparatus, in personal computers, in smart phones, in digital cameras, in video cameras, in televisions, in Internet terminals, in scientific apparatus, in surveillance and/or security systems, in satellites configured for ground-monitoring functions, in seismic sensing systems, but not limited thereto.

Embodiments of the disclosure are capable of enabling more efficient delivery of tables, for example coding tables, frequency tables, probability tables or lengths of code words, thereby making it attractive to split data into smaller chunks of data, for example which can then be encoded individually in an optimal manner. Moreover, the tables are optionally encoded using an entropy encoding method. These smaller data chunks optionally need their own corresponding code table, frequency table, probability table or lengths of code words; this is beneficial if there are many different tables available, as only the indices of given tables need to be delivered for different data chunks. Otherwise, the new table also needs to be delivered to the decoder 60. When a given table is delivered, it is often beneficial to store it in a data memory, for example a data memory of the decoder 60, for future use with its own unique reference index.

In an example embodiment of the disclosure, every data block is delivered as an individual data block, with supporting information sent describing how many data blocks belong to a mutually similar body of data; such communication of the data blocks is often quite inefficient, because, for all the data blocks, there is need to deliver an identification of coding method employed, an amount of symbols, and a code table, frequency table or probability table that is employed. Additionally, the number of data blocks belonging to the mutually similar body of data also needs to be delivered from the encoder 50 to the decoder 60.

Optionally, in the code table, there is beneficially employed an insertion of one or more additional symbols that have their own corresponding meaning. Typically, in big code tables, an "escape" symbol beneficially has its own code word. Moreover, there is beneficially also an own code word available for "end of coefficients" symbol in the coding table that is used for DCT coefficients in JPEG. This means that the method is already known to the decoder 60, such that the method can be utilized in a very efficient manner by adding new coding symbols that can be used, for example, for "change of code table", "end of data" and also for "escape", if it is needed. These additional symbols can be generated so that their frequency is 1 every time when they are to be used. If an available table is used, then a corresponding identification is added as a symbol so that it splits the code with one of the symbols that has the longest code word. If there is data left, for example there is a new data chunk after a current data chunk, the encoder 50 beneficially uses a "change of coding table" symbol and not an "end of data" symbol. When this "change of coding table" symbol is delivered, an index of the new coding table is delivered after it. The value of index defining the new coding table is, for example, employed when there is no table available and from 1 to amount of tables when there are already tables available. Optionally, this index for the new coding table has a value that uses as many bits as it is required to present all the available or suitable tables for the data. If a value 0 is delivered as an index for the new coding table, then the delivery of code table is needed before the next symbols are encoded to a data stream provided from the encoder 50 to the decoder 60. Otherwise, after the index identifying the new coding table, new symbols can be immediately encoded within this new coding table. When a last data chunk is coded and a last data value is delivered to the decoder 60, the encoder 50 delivers the "end of data" symbol. In this case, only the "end of data" symbol is valid and "change of coding table" is not used. When the "end of data" symbol is delivered, there is no need to continue delivery of any data thereafter. This "end of data" symbol enables there to be no need to deliver the number of data values for each data chunk. Moreover, neither the coding method is needed to be delivered to the decoder 60, because only the used code table, frequency table, probability table or lengths of code words, is changed for different data chunks. Thus, the total amount of overhead data to be sent from the encoder 50 to the decoder 60 is quite small when the code table is changed during the encoding and subsequent decoding of data. One trailing bit is needed to detect if a symbol pertains to "change of code table" or to "end of data", or it is possible to generate both symbols with frequency 1 to the code table.

Occasionally, it is beneficial to send the amount of data values, the amount of encoded data or use the "end of data" symbol depending on the data, the amount of data, used coding method and implementation of decoder 60 and encoder 50. Moreover, it is optionally beneficial to employ parallelism when processing data in the encoder 50 and/or decoder 60, namely the amount of coded data is delivered and so the decoder 60 can easily split the data for different processors, processes and threads. Typically, there is often a variety of approaches that is best suited to deliver information regarding how many data values need to be decoded and, in such case, there is no need to deliver a corresponding selection; however, when multiple best choices are available, the encoder 50 selects the method and delivers a corresponding decision regarding a most suitable choice to the decoder 60.

It will be appreciated from the foregoing, that the decoder 60 implements substantially an inverse of encoding functions executed in the encoder 50, when the data D1 and the data D3 are to be mutually substantially similar, for example as illustrated in FIG. 3A. However, many practical situations, for example when multicasting the encoded data E2 to a plurality of mutually different devices, require use of a transcoder 70 to transcode the data D3 to generate corresponding transcoded data D4 which is compatible with a given device hosting the decoder 60 and its associated transcoder 70, as illustrated in FIG. 3B Optionally, both the decoder 60 and the transcoder 70 are implemented using computing hardware; optionally, the transcoder 70 is implemented in dedicated transcoding hardware, for example a hardware dongle or similar. Embodiments of the present disclosure are susceptible to being configured to provide lossless or lossy encoding and decoding of data. Optionally, the decoder 60 is also operable to perform transcoding, for example providing data to a display device which is different to that required to render the data (D1). In such a case, the data processed through the codec 100 is never decoded back to its original format. Instead, the encoded data E2 is, for example, converted directly into some other format, in which it would then be rendered, for example to a screen or stored into a file. An example embodiment of such transcoding is where the data D1 was originally in YUV format, and then it is compressed and transmitted to a receiver; the receiver recovers the data block-by-block, and performs color conversion on it and scales it into an RGB image suitable to be rendered on a screen, without even reconstructing a full resolution YUV result image.

The decoder 60 is operable to employ a method of decoding encoded data (E2) generated by the encoder 50, for generating corresponding decoded data (D3), wherein the method includes following steps of:

(i) receiving the encoded data (E2) and extracting therefrom one or more sets of indices, together with one or more frequency tables, and/or one or more code tables, and/or one or more length of code word tables, and/or one or more probability tables, and/or information indicative of such one or more tables;

(ii) computing from the one or more sets of indices corresponding symbols in one or more data chunks and/or compressed symbols of entries in the one or more code tables, and/or the one or more frequency tables, and/or the one or more length of code word tables, and/or one or more probability tables; and (iii) regenerating from the symbols one or more data chunks, using information from the one or more code tables, and/or one or more frequency tables, and/or one or more length of code word tables, and/or one or more probability tables; and (iv) combining and/or transforming the one or more data chunks to generate the decoded data (D3).

Optionally, the method includes receiving at least one of the one or more tables in a manner in which the at least one of the one or more tables is storable for subsequent reuse.

Optionally, the method includes applying one or more data decompression algorithms in step (iv) to generate the decoded data (D3). More optionally, in the method, the one or more data decompression algorithms include at least one of: Huffman decoding, VLC decoding, entropy decoding, Arithmetic decoding, Range decoding.

Optionally, the method includes combining a plurality of the one or more data chunks to generate he decoded data (D3) by employing a parallel architecture of processors for processing the plurality of data chunks in a substantially concurrent manner.

Optionally, the method includes generating the one or more sets of indices based on multiple data values that are combined together. More optionally, in the method, the indices are derived from one or more RGB-pixels that contain R, G and B pixel values or Y, U and V pixel values. More optionally, the method includes switching dynamically between generating the one or more data chunks either unencoded or encoded into the encoded data (E2), as a function of an achievable data decompression ratio for the data chunks when included in the encoded data (E2).

Optionally, in the method, the decoder 60 is operable to extract from the encoded data (E2) at least one trailing bit which is indicative of if a symbol pertains to "change of code table" or to "end of data".

Optionally, the method includes generating a given data chunk substantially from only enough indices required for referencing to one or more symbols present in the given data chunk.

Optionally, the method includes decompressing the one or more code tables included in the encoded data (E2). More optionally, the method includes decompressing the one or more code tables by employing Huffman decoding. More optionally, in the method, decompression of the one or more code tables employs one or more subsidiary code tables.

Optionally, the method includes receiving the one or more code tables in manner which enables the one or more code tables to be employed in the decoder (60) for decoding subsequently sent data.

Optionally, the method includes extracting from the encoded data (E2) one or more identification codes indicating from where the one or more code table are susceptible to being accessed, via one or more databases, and/or one or more proxy databases.

Optionally, the method includes decoding one or more of following types of data: captured audio signals, captured video signals, captured images, text data, seismographic data, sensor signals, analog-to-digital (ADC) converted data, biomedical signal data, calendar data, economic data, mathematical data, binary data.

Optionally, the method includes receiving the encoded data (E2) from a plurality of data sources, and to combine data provided from the sources to regenerate the encoded data (E2).

The decoder 60 is operable to implement the aforementioned method of decoding the encoded data (E2) to generate the decoded data (D3); there is provided a decoder 60 for decoding the encoded data (E2) generated by the encoder 50, wherein the decoder 60 is operable:

(i) to receive the encoded data (E2) and to extract therefrom one or more sets of indices, together with one or more frequency tables, and/or one or more code tables, and/or one or more length of code word tables, and/or one or more probability tables, and/or information indicative of such one or more tables;

(ii) to compute from the one or more sets of indices corresponding symbols in one or more data chunks and/or compressed symbols of entries in the one or more code tables, and/or the one or more frequency tables, and/or the one or more length of code word tables, and/or one or more probability tables; and (iii) to regenerate from the symbols one or more data chunks, using information from the one or more code tables, and/or one or more frequency tables, and/or one or more length of code word tables, and/or one or more probability tables; and (iv) to combine and/or transform the one or more data chunks to generate the decoded data (D3).

Optionally, the decoder 60 further includes a transcoder 70 for transcoding the decoded data (D3) to generate corresponding transcoded data (D4) and/or generating the corresponding transcoded data (D4) from the encoded data (E2).

Optionally, the decoder 60 is operable to receive at least one of the one or more tables in a manner in which the at least one of the one or more tables is storable for subsequent reuse.

Optionally, the decoder 60 is operable to apply one or more data decompression algorithms in step (iv) to generate the decoded data (D3). More optionally, in the decoder 60, the one or more data decompression algorithms includes at least one of: Huffman decoding, VLC decoding, entropy decoding, Arithmetic decoding, Range decoding.

Optionally, the decoder 60 is operable to combine a plurality of the one or more data chunks to generate he decoded data (D3) by employing a parallel architecture of processors for processing the plurality of data chunks in a substantially concurrent manner.

Optionally, the decoder 60 is operable to generate the one or more sets of indices based on multiple data values that are combined together. More optionally, in the decoder 60, the indices are derived from one or more RGB-pixels that contain R, G and B pixel values or Y, U and V pixel values. More optionally, the decoder 60 is operable to switch dynamically between generating the one or more data chunks either unencoded or encoded into the encoded data (E2), as a function of an achievable data decompression ratio for the data chunks when included in the encoded data (E2).

Optionally, the decoder 60 is operable to extract from the encoded data (E2) at least one trailing bit which is indicative of if a symbol pertains to "change of code table" or to "end of data".

Optionally, the decoder 60 is operable to generate a given data chunk substantially from only enough indices required for referencing to one or more symbols present in the given data chunk.

Optionally, the decoder 60 is operable to decompress the one or more code tables included in the encoded data (E2). More optionally, the decoder 60 is operable to decompress the one or more code tables by employing Huffman decoding. More optionally, in the decoder 60, decompression of the one or more code tables employs one or more subsidiary code tables.

Optionally, the decoder 60 is operable to receive the one or more code tables in manner which enables the one or more code tables to be employed in the decoder (60) for decoding subsequently sent data.

Optionally, the decoder 60 is operable to extract from the encoded data (E2) one or more identification codes indicating from where the one or more code table are susceptible to being accessed, via one or more databases, and/or one or more proxy databases.

Optionally, the decoder 60 is operable to decode one or more of following types of data: captured audio signals, captured video signals, captured images, text data, seismographic data, sensor signals, analog-to-digital (ADC) converted data, biomedical signal data, calendar data, economic data, mathematical data, binary data.

Optionally, the decoder 60 is operable to receive the encoded data (E2) from a plurality of data sources, and to combine data provided from the sources to regenerate the encoded data (E2). For example, the plurality of sources are included in a peer-to-peer data communication network which communicates the encoded data (E2) from the encoder 50 to the decoder 60.

Modifications to embodiments of the invention described in the foregoing are possible without departing from the scope of the invention as defined by the accompanying claims. Expressions such as "including", "comprising", "incorporating", "consisting of", "have", "is" used to describe and claim the present invention are intended to be construed in a non-exclusive manner, namely allowing for items, components or elements not explicitly described also to be present. Reference to the singular is also to be construed to relate to the plural. Numerals included within parentheses in the accompanying claims are intended to assist understanding of the claims and should not be construed in any way to limit subject matter claimed by these claims.

We claim:

1. A method of encoding input data in an encoder to generate corresponding encoded data, the method comprising:

(a) analyzing symbols present in the input data and splitting and/or transforming the input data into one or more data chunks;

(b) generating as a function of occurrence of the symbols at least one of: one or more code tables, one or more frequency tables, one or more length of code word tables, one or more probability tables for the symbols present in the one or more data chunks;

(c) computing one or more sets of indices relating the symbols in each data chunk to entries in at least one of: the one or more code tables, the one or more frequency tables, the one or more length of code word tables, the one or more probability tables;

(d) assembling information of the one or more sets of indices relating the symbols in each data chunk, together with at least one of: the one or more frequency tables, the one or more code tables, the one or more length of code word tables, the one or more probability tables, information indicative of the one or more tables, to the encoded data; and (e) compressing the symbols within the one or more tables to the encoded data.

2. The method as claimed in claim 1, wherein at least one of the one or more tables is pre-defined.

3. The method as claimed in claim 1, wherein the method includes delivering the encoded data containing the information of the one or more sets of indices relating the symbols in each data chunk, together with at least one of: the one or more frequency tables, the one or more code tables, the one or more length of code word tables, the one or more probability tables, the information indicative of the one or more tables as well as the compressed symbols.

4. The method as claimed in claim 1, wherein the method includes generating the one or more tables for being regenerated during decoding based upon their symmetry and corresponding symmetry-indicative information.

5. The method as claimed in claim 1, wherein the method includes delivering at least one of the one or more tables in a manner in which the at least one of the one or more tables is storable for subsequent reuse.

6. The method as claimed in claim 1, wherein the information of the one or more sets of indices includes:

(i) indices of the symbols that occur in the chunk as such, and of which probability values are to be inserted into the encoded data, preceded by a total count of indices in the data chunk; or (ii) bits expressing which symbols out of all possible symbol values occur in the chunk and for which symbols probability values are to be inserted into the encoded data; or (iii) information stating that starting from the beginning, all symbol value probabilities to be inserted into the encoded data, which in itself also expresses the count of indices.

7. The method as claimed in claim 1, wherein the method includes applying one or more data compression algorithms in step (d) to generate the encoded data.

8. The method as claimed in claim 7, wherein the one or more data compression algorithms include at least one of: Huffman encoding, VLC, entropy encoding, Arithmetic encoding, Range encoding.

9. The method as claimed in claim 1, wherein the method includes splitting the input data into a plurality of data chunks and employing a parallel architecture of processors for processing the plurality of data chunks in a substantially concurrent manner.

10. The method as claimed in claim 1, wherein the method includes generating the one or more sets of indices based on multiple data values that are combined together.

11. The method as claimed in claim 10, wherein the indices are derived from one or more RGB-pixels or YUV pixels that contain R, G and B pixel values or Y, U and V pixel values.

12. The method as claimed in claim 10, wherein the method includes dynamically switching between assembling the data chunks either unencoded or encoded into the encoded data, as a function of an achievable data compression ratio for the data chunks when included in the encoded data.

13. The method as claimed in claim 1, wherein the method includes incorporating into the encoded data at least one trailing bit to indicate if a symbol pertains to "change of code table" or to "end of data".

14. The method as claimed in claim 1, wherein the method includes generating for a given data chunk substantially only enough indices required for referencing to one or more symbols present in the given data chunk.

15. The method as claimed in claim 1, wherein the method further includes compressing the one or more code tables for inclusion in the encoded data.

16. The method as claimed in claim 15, wherein the one or more code tables are compressed by employing Huffman coding.

17. The method as claimed in claim 15, wherein compression of the one or more code tables employs one or more subsidiary code tables.

18. The method as claimed in claim 1, wherein that the method includes communicating the one or more code tables in a manner which enables the one or more code tables to be employed in a decoder for decoding subsequently sent data.

19. The method as claimed in claim 1, wherein that the method includes a step of including in the encoded data one or more identification codes indicating from where the one or more code table are susceptible to being accessed, via one or more databases, and/or one or more proxy databases.

20. The method as claimed in claim 1, wherein the method is arranged to encode one or more of following types of data: captured audio signals, captured video signals, captured images, text data, seismographic data, sensor signals, analog-to-digital (ADC) converted data, biomedical signal data, calendar data, economic data, mathematical data, binary data.

21. The method as claimed in claim 1, wherein the method includes:

(i) receiving the encoded data and extracting therefrom information of one or more sets of indices, together with at least one of: one or more frequency tables, one or more code tables, one or more length of code word tables, one or more probability tables, information indicative of the one or more tables;

(ii) computing from the one or more sets of indices corresponding symbols in at least one of: one or more data chunks, compressed symbols of entries in the one or more code tables, the one or more frequency tables, the one or more length of code word tables, the one or more probability tables;

(iii) regenerating from the symbols one or more data chunks, using information from at least one of: the one or more code tables, the one or more frequency tables, the one or more length of code word tables, the one or more probability tables; and (iv) combining and/or transforming the one or more data chunks to generate the decoded data.

22. The method as claimed in claim 21, wherein at least one of the one or more tables is pre-defined.

23. The method as claimed in claim 21, wherein the method includes transcoding the decoded data to generate corresponding transcoded data and/or generating the corresponding transcoded data from the encoded data.

24. The method as claimed in claim 21, wherein the method includes regenerating the one or more tables based upon their symmetry and corresponding symmetry-indicative information.

25. The method as claimed in claim 21, wherein the method includes receiving at least one of the one or more tables in a manner in which the at least one of the one or more tables is storable for subsequent reuse.

26. The method as claimed in claim 21, wherein the method includes applying one or more data decompression algorithms in step (iv) to generate the decoded data.

27. The method as claimed in claim 26, wherein the one or more data decompression algorithms include at least one of: Huffman decoding, VLC decoding, entropy decoding, Arithmetic decoding, Range decoding.

28. The method as claimed in claim 21, wherein the method includes combining a plurality of the one or more data chunks to generate the decoded data by employing a parallel architecture of processors for processing the plurality of data chunks in a substantially concurrent manner.

29. The method as claimed in claim 21, wherein the method includes generating the one or more sets of indices based on multiple data values that are combined together.

30. The method as claimed in claim 29, wherein the indices are derived from one or more RGB-pixels or YUV-pixels that contain R, G and B pixel values or Y, U and V pixel values.

31. The method as claimed in claim 29, wherein the method includes switching dynamically between generating the one or more data chunks either unencoded or encoded into the encoded data, as a function of an achievable data decompression ratio for the data chunks when included in the encoded data.

32. The method as claimed in claim 21, wherein the decoder is operable to extract from the encoded data at least one trailing bit which is indicative of if a symbol pertains to "change of code table" or to "end of data".

33. The method as claimed in any one or claim 21, wherein the method includes generating a given data chunk substantially from only enough indices required for referencing to one or more symbols present in the given data chunk.

34. The method as claimed in claim 21, wherein the method includes decompressing the one or more code tables included in the encoded data.

35. The method as claimed in claim 34, wherein the method includes decompressing the one or more code tables by employing Huffman decoding.

36. The method as claimed in claim 34, wherein decompression of the one or more code tables employs one or more subsidiary code tables.

37. The method as claimed in claim 21, wherein the method includes receiving the one or more code tables in a manner which enables the one or more code tables to be employed in the decoder for decoding subsequently sent data.

38. The method as claimed in claim 21, wherein the method includes extracting from the encoded data one or more identification codes indicating from where the one or more code table are susceptible to being accessed, via one or more databases, and/or one or more proxy databases.

39. The method as claimed in claim 21, wherein the method includes decoding one or more of following types of data: captured audio signals, captured video signals, captured images, text data, seismographic data, sensor signals, analog-to-digital (ADC) converted data, biomedical signal data, calendar data, economic data, mathematical data, binary data.

40. The method as claimed in claim 21, wherein the method includes receiving the encoded data from a plurality of data sources, and to combine data provided from the sources to regenerate the encoded data.

41. A computer program product comprising a non-transitory computer-readable storage medium having computer-readable instructions stored thereon, the computer-readable instructions being executable by a computerized device comprising processing hardware to execute a method comprising:
(a) analyzing symbols present in the input data and splitting and/or transforming the input data into one or more data chunks;
(b) generating as a function of occurrence of the symbols at least one of: one or more code tables, one or more frequency tables, one or more length of code word tables, one or more probability tables for the symbols present in the one or more data chunks;
(c) computing one or more sets of indices relating the symbols in each data chunk to entries in at least one of: the one or more code tables, the one or more frequency tables, the one or more length of code word tables, the one or more probability tables;
(d) assembling information of the one or more sets of indices relating the symbols in each data chunk, together with at least one of: the one or more frequency tables, the one or more code tables, the one or more length of code word tables, the one or more probability tables, information indicative of the one or more tables, to the encoded data; and
(e) compressing the symbols within the one or more tables to the encoded data.

42. An encoder for encoding input data to generate corresponding encoded data, the method comprising:
(a) an analyzer for analyzing symbols present in the input data, and for splitting and/or transforming the input data into one or more data chunks;
(b) a generator for generating, as a function of occurrence of the symbols at least one of: one or more code tables, one or more frequency tables, one or more length of code word tables, one or more probability tables for the symbols present in the one or more data chunks;
(c) a computing engine for computing one or more sets of indices relating the symbols in each data chunk to entries in at least one of: the one or more code tables, the one or more frequency tables, the one or more length of code word tables, the one more probability tables;
(d) a data assembler for assembling information of the one or more sets of indices relating the symbols in each data chunk, together with at least one of: the one or more frequency tables, the one or more code tables, the one or more length of code word tables, the one or more probability tables information indicative of the one or more tables, to the encoded data; and
(e) a compressor for compressing the symbols within the one or more tables to the encoded data.

43. An encoder as claimed in claim 42, wherein the encoder is operable to deliver the encoded data containing the information of the one or more sets of indices relating the symbols in each data chunk, together with at least one of: the one or more frequency tables, the one or more code tables, the one or more length of code word tables, the one or more probability tables, the information indicative of the one or more tables as well as the compressed symbols.

44. An encoder as claimed in claim 43, wherein the encoder is operable to deliver at least one of the one or more tables in a manner in which the at least one of the one or more tables is storable for subsequent reuse.

45. The encoder as claimed in claim 42, wherein the encoder is operable to apply one or more data compression algorithms in the data assembler to generate the encoded data.

46. The encoder as claimed in claim 45, wherein the one or more data compression algorithms include at least one of: Huffman encoding, VLC, entropy encoding, Arithmetic encoding, Range encoding.

47. The encoder as claimed in claim 42, wherein the encoder is operable to split the input data into a plurality of data chunks and to employ a parallel architecture of processors for processing the plurality of data chunks in a substantially concurrent manner.

48. The encoder as claimed in claim 42, wherein the generator is operable to generate the one or more sets of indices based on multiple data values that are combined together.

49. The encoder as claimed in claim 48, wherein the indices are derived from one or more RGB-pixels or YUV-pixels that contain R, G and B pixel values or Y, U and V pixel values.

50. The encoder as claimed in claim 49, wherein the encoder is operable to switch dynamically between assembling the data chunks either unencoded or encoded into the encoded data, as a function of an achievable data compression ratio (achievable) for the data chunks when included in the encoded data.

51. The encoder as claimed in claim 42, wherein the encoder is operable to incorporate into the encoded data at least one trailing bit to indicate if a symbol pertains to "change of code table" or to "end of data".

52. The encoder as claimed in claim 42, wherein the generator is operable to generate for a given data chunk substantially only enough indices required for referencing to one or more symbols present in the given data chunk.

53. The encoder as claimed in claim 42, further comprising a decoder that is operable:
(i) to receive the encoded data and to extract therefrom information of one or more sets of indices, together with at least one of: one or more frequency tables, one or more code tables, one or more length of code word tables, one or more probability tables, information indicative of the one or more tables;
(ii) to compute from the one or more sets of indices corresponding symbols in at least one of: one or more data chunks, compressed symbols of entries in the one or more code tables, the one or more frequency tables, the one or more length of code word tables, the one or more probability tables;
(iii) to regenerate from the symbols one or more data chunks, using information from at least one of: the one or more code tables, the one or more frequency tables, the one or more length of code word tables, the one or more probability tables; and
(iv) to combine and/or transform the one or more data chunks to generate the decoded data.

54. The decoder as claimed in claim 53, wherein the decoder further includes a transcoder for transcoding the decoded data to generate corresponding transcoded data and/or generating the corresponding transcoded data from the encoded data.

55. The decoder as claimed in claim 53, wherein the decoder is operable to regenerate the one or more tables based upon their symmetry and corresponding symmetry-indicative information provided to the decoder.

56. The decoder as claimed in claim 53, wherein the decoder is operable to receive at least one of the one or more tables in a manner in which the at least one of the one or more tables is storable for subsequent reuse.

57. The decoder as claimed in claim 53, wherein the decoder is operable to apply one or more data decompression algorithms in (iv) to generate the decoded data.

58. The decoder as claimed in claim 57, wherein the one or more data decompression algorithms include at least one of: Huffman decoding, VLC decoding, entropy decoding, Arithmetic decoding, Range decoding.

59. The decoder as claimed in claim 53, wherein the decoder is operable to combine a plurality of the one or more data chunks to generate the decoded data by employing a parallel architecture of processors for processing the plurality of data chunks in a substantially concurrent manner.

60. The decoder as claimed in claim 53, wherein the decoder is operable to generate the one or more sets of indices based on multiple data values that are combined together.

61. The decoder as claimed in claim 60, wherein the indices are derived from one or more RGB-pixels or YUV-pixels that contain R, G and B pixel values or Y, U and V pixel values.

62. The decoder as claimed in claim 60, wherein the decoder is operable to switch dynamically between generating the one or more data chunks either unencoded or encoded into the encoded data, as a function of an achievable data decompression ratio for the data chunks when included in the encoded data.

63. The decoder as claimed in claim 53, wherein the decoder is operable to extract from the encoded data at least one trailing bit which is indicative of if a symbol pertains to "change of code table" or to "end of data".

64. The decoder as claimed in claim 53, wherein the decoder is operable to generate a given data chunk substantially from only enough indices required for referencing to one or more symbols present in the given data chunk.

65. The decoder as claimed in claim 53, wherein the decoder is operable to decompress the one or more code tables included in the encoded data.

66. The decoder as claimed in claim 65, wherein the decoder is operable to decompress the one or more code tables by employing Huffman decoding.

67. The decoder as claimed in claim 65, wherein decompression of the one or more code tables employs one or more subsidiary code tables.

68. The decoder as claimed in claim 53, wherein the decoder is operable to receive the one or more code tables in a manner which enables the one or more code tables to be employed in the decoder for decoding subsequently sent data.

69. The decoder as claimed in claim 53, wherein the decoder is operable to extract from the encoded data one or more identification codes indicating from where the one or more code table are susceptible to being accessed, via one or more databases, and/or one or more proxy databases.

70. The decoder as claimed in claim 53, wherein the decoder is operable to decode one or more of following types of data: captured audio signals, captured video signals, captured images, text data, seismographic data, sensor signals, analog-to-digital (ADC) converted data, biomedical signal data, calendar data, economic data, mathematical data, binary data.

71. The decoder as claimed in claim 53, wherein the decoder is operable to receive the encoded data from a plurality of data sources, and to combine data provided from the sources to regenerate the encoded data.

72. The encoder as claimed in claim 53, wherein a codec includes the at least one encoder for encoding input data to generate corresponding encoded data, and the at least one decoder for decoding the encoded data to generate decoded output data.

73. The codec as claimed in claim 72, wherein the at least one encoder and the at least one decoder are mutually spatially remote and mutually coupled together via a data communication network.

74. The codec as claimed in claim 72, wherein the data communication network is configured in a manner of a peer-to-peer communication network.

75. The codec as claimed in claim 72, wherein the encoder and the decoder are symmetrical in their processing of data therethrough.

* * * * *

UNITED STATES PATENT AND TRADEMARK OFFICE
CERTIFICATE OF CORRECTION

PATENT NO. : 9,729,169 B2
APPLICATION NO. : 15/119365
DATED : August 8, 2017
INVENTOR(S) : Ossi Kalevo, Tuomas Karkkainen and Artur Huhtaniemi It is certified that error appears in the above-identified patent and that said Letters Patent is hereby corrected as shown below:

In the Claims

In Claim 21, Column 32, Line 41, please delete "The" and insert --A-- before method; after method please insert --in a decoder of decoding encoded data--; after as claimed in Claim 1, please insert --for generating corresponding decoded data,--; please delete "wherein" and insert --characterized in that-- before the method includes.

In Claim 53, Column 35, Line 42, please delete "The" and insert --A decoder for decoding encoded data generated by the-- before encoder; after as claimed in claim 42, please insert --for generating corresponding decoded data, characterized in that-- and please delete "further comprising".

In Claim 53, Column 35, Line 43, please delete "a" and insert --the-- before decorder.

In Claim 72, Column 37, Line 8, please delete "The" and insert --A codec characterized in that the codec includes at least one-- before encoder; please insert --42,-- after claim; and please delete "53, wherein a codec includes the at least one encoder".

In Claim 72, Column 37, Line 10, please delete "the" before at.

Signed and Sealed this
Twenty-seventh Day of March, 2018

Andrei Iancu
*Director of the United States Patent and Trademark Office*